United States Patent
Xie et al.

(10) Patent No.: US 12,310,064 B2
(45) Date of Patent: May 20, 2025

(54) ISOLATION PILLAR STRUCTURES FOR STACKED DEVICE STRUCTURES

(71) Applicant: International Business Machines Corporation, Armonk, NY (US)

(72) Inventors: Ruilong Xie, Niskayuna, NY (US); Julien Frougier, Albany, NY (US); Kangguo Cheng, Schenectady, NY (US); Chanro Park, Clifton Park, NY (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 511 days.

(21) Appl. No.: 17/877,414

(22) Filed: Jul. 29, 2022

(65) Prior Publication Data
US 2024/0038867 A1    Feb. 1, 2024

(51) Int. Cl.
| | |
|---|---|
| H10D 30/67 | (2025.01) |
| H10D 62/10 | (2025.01) |
| H10D 84/01 | (2025.01) |
| H10D 84/03 | (2025.01) |
| H10D 84/85 | (2025.01) |

(52) U.S. Cl.
CPC ....... *H10D 30/6735* (2025.01); *H10D 62/121* (2025.01); *H10D 84/0128* (2025.01); *H10D 84/038* (2025.01); *H10D 84/856* (2025.01)

(58) Field of Classification Search
CPC ..... H10D 62/121; H10D 30/43; H10D 30/014
See application file for complete search history.

(56) References Cited

U.S. PATENT DOCUMENTS

| | | | |
|---|---|---|---|
| 8,196,088 B2 | 6/2012 | Oppoid | |
| 10,192,867 B1 | 1/2019 | Frougier et al. | |
| 10,510,620 B1 | 12/2019 | Chanemougame et al. | |
| 10,714,569 B1 * | 7/2020 | Kong | H10D 30/796 |

(Continued)

FOREIGN PATENT DOCUMENTS

| | | |
|---|---|---|
| TW | 201941435 A | 10/2019 |
| TW | 202135242 A | 9/2021 |

(Continued)

OTHER PUBLICATIONS

S.B. Samavedam et al., "Future Logic Scaling: Towards Atomic Channels and Deconstructed Chips," IEEE International Electron Devices Meeting (IEDM), Dec. 12-18, 2020, 10 pages.

(Continued)

*Primary Examiner* — Evren Seven
(74) *Attorney, Agent, or Firm* — Samuel Waldbaum; Ryan, Mason & Lewis, LLP

(57) ABSTRACT

A microelectronic structure comprises a first stacked device structure comprising a first upper device and a first lower device, a second stacked device structure comprising a second upper device and a second lower device, and an isolation pillar structure located between the first and second stacked device structures. The isolation pillar structure has an upper section contacting the first and second upper devices and a lower section contacting the first and second lower devices. The upper section of the isolation pillar structure has a first width and the lower section of the isolation pillar structure has a second width different than the first width.

25 Claims, 32 Drawing Sheets

(56) References Cited

U.S. PATENT DOCUMENTS

| | | |
|---|---|---|
| 11,164,942 B1 | 11/2021 | Weckx et al. |
| 11,195,746 B2 | 12/2021 | Xie et al. |
| 11,264,274 B2 | 3/2022 | Smith et al. |
| 11,545,497 B2 | 1/2023 | Chanemougame et al. |
| 11,742,247 B2 | 8/2023 | Lin et al. |
| 2007/0223288 A1 | 9/2007 | Partsch |
| 2019/0393214 A1 | 12/2019 | Lilak et al. |
| 2020/0075574 A1 | 3/2020 | Smith et al. |
| 2020/0303388 A1 | 9/2020 | Reznicek et al. |
| 2020/0303500 A1* | 9/2020 | Loubet ............... H01L 21/02532 |
| 2021/0013108 A1* | 1/2021 | Wu ..................... H10D 84/0195 |
| 2021/0193821 A1* | 6/2021 | Dentoni Litta ...... H10D 30/014 |
| 2021/0202500 A1 | 7/2021 | Chanemougame et al. |
| 2021/0210489 A1* | 7/2021 | Zhang ................ H10D 84/0188 |
| 2021/0407999 A1 | 12/2021 | Huang et al. |
| 2022/0037535 A1* | 2/2022 | Yang .................... H10D 62/121 |
| 2022/0068725 A1* | 3/2022 | Chan ..................... H10D 86/01 |
| 2022/0130822 A1 | 4/2022 | Chiu et al. |
| 2022/0130955 A1 | 4/2022 | Cheng et al. |
| 2022/0238717 A1 | 7/2022 | Ju et al. |
| 2023/0053433 A1 | 2/2023 | Serizawa et al. |

FOREIGN PATENT DOCUMENTS

| | | |
|---|---|---|
| TW | 202207372 A | 2/2022 |
| WO | 2021229740 A1 | 11/2021 |
| WO | PCT/IB2023/056308 | 9/2023 |

OTHER PUBLICATIONS

J. Ryckaert et al., "The Complementary FET (CFET) for CMOS Scaling beyond N3," IEEE Symposium on VLSI Technology, Jun. 2018, 2 pages.

* cited by examiner

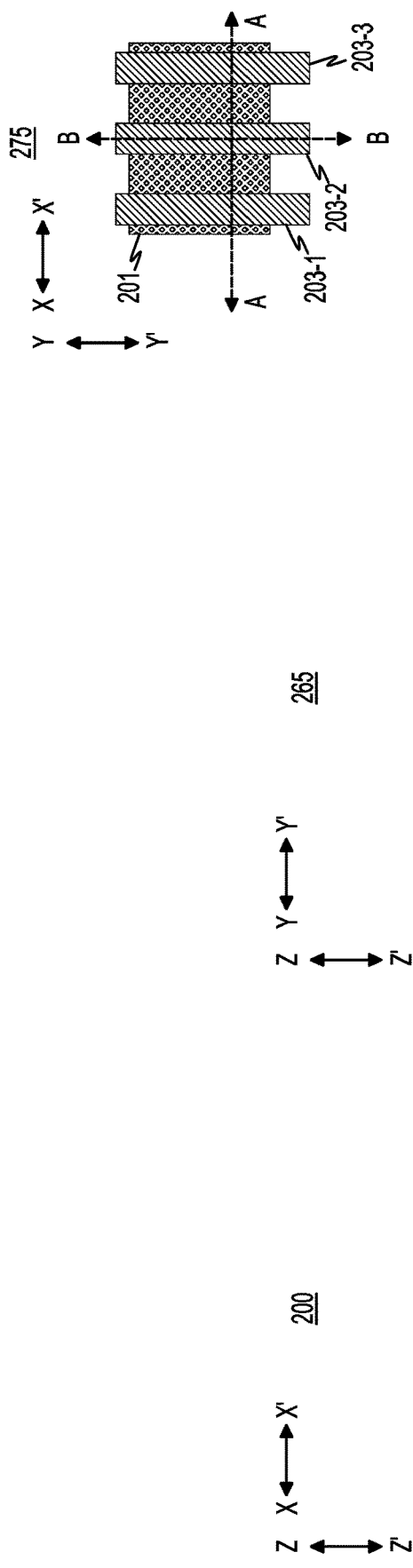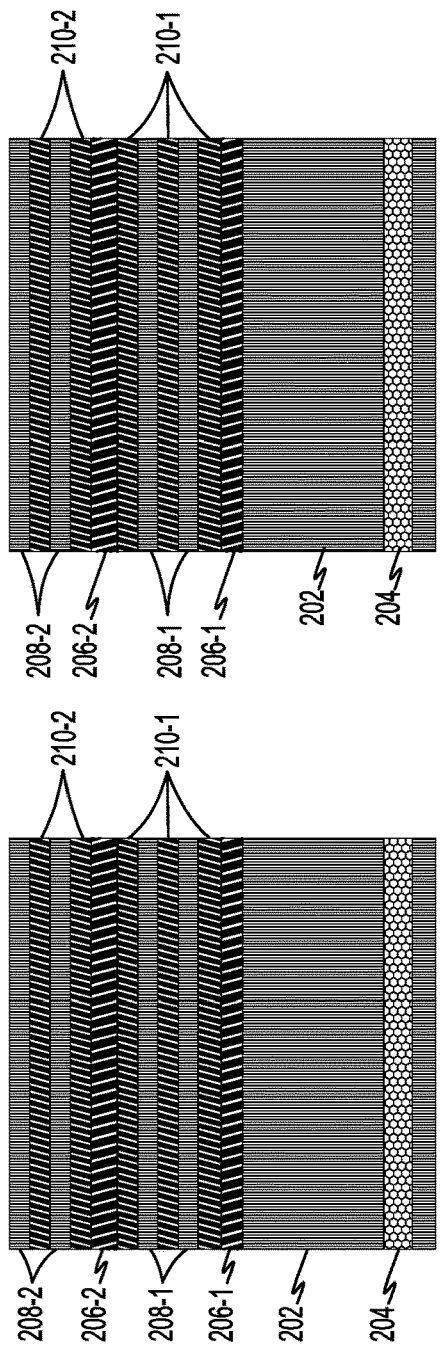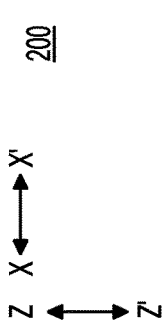

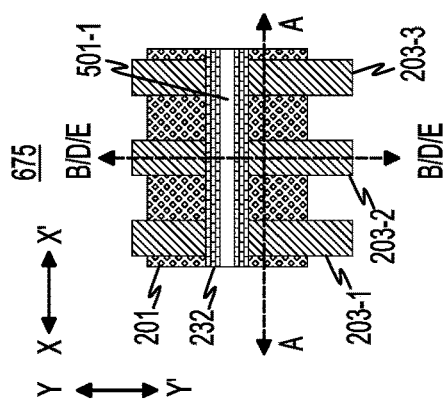
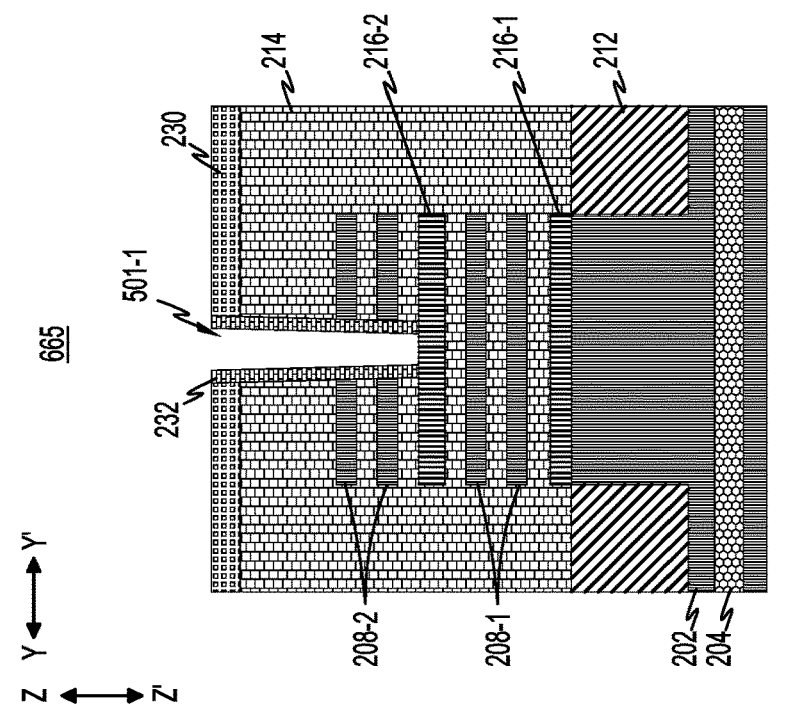
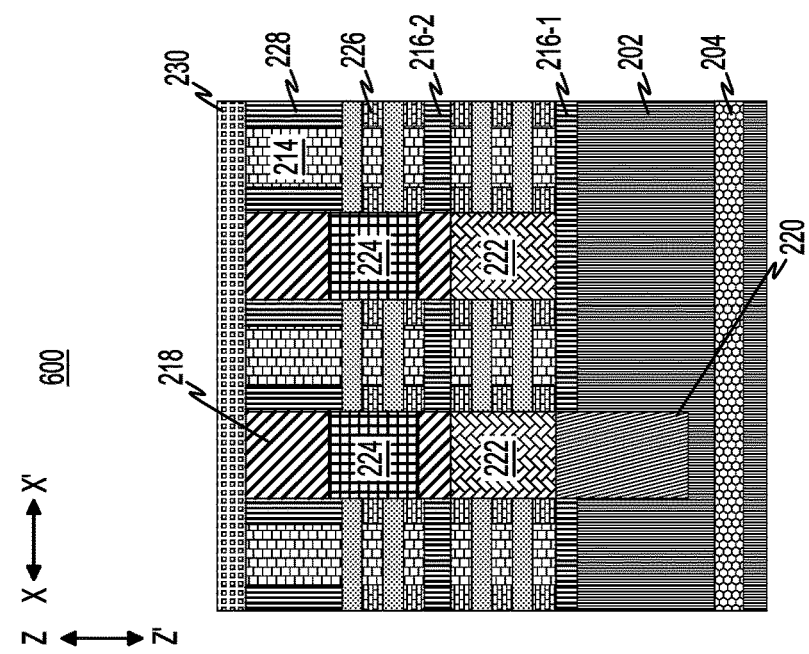
FIG. 6C
FIG. 6B
FIG. 6A

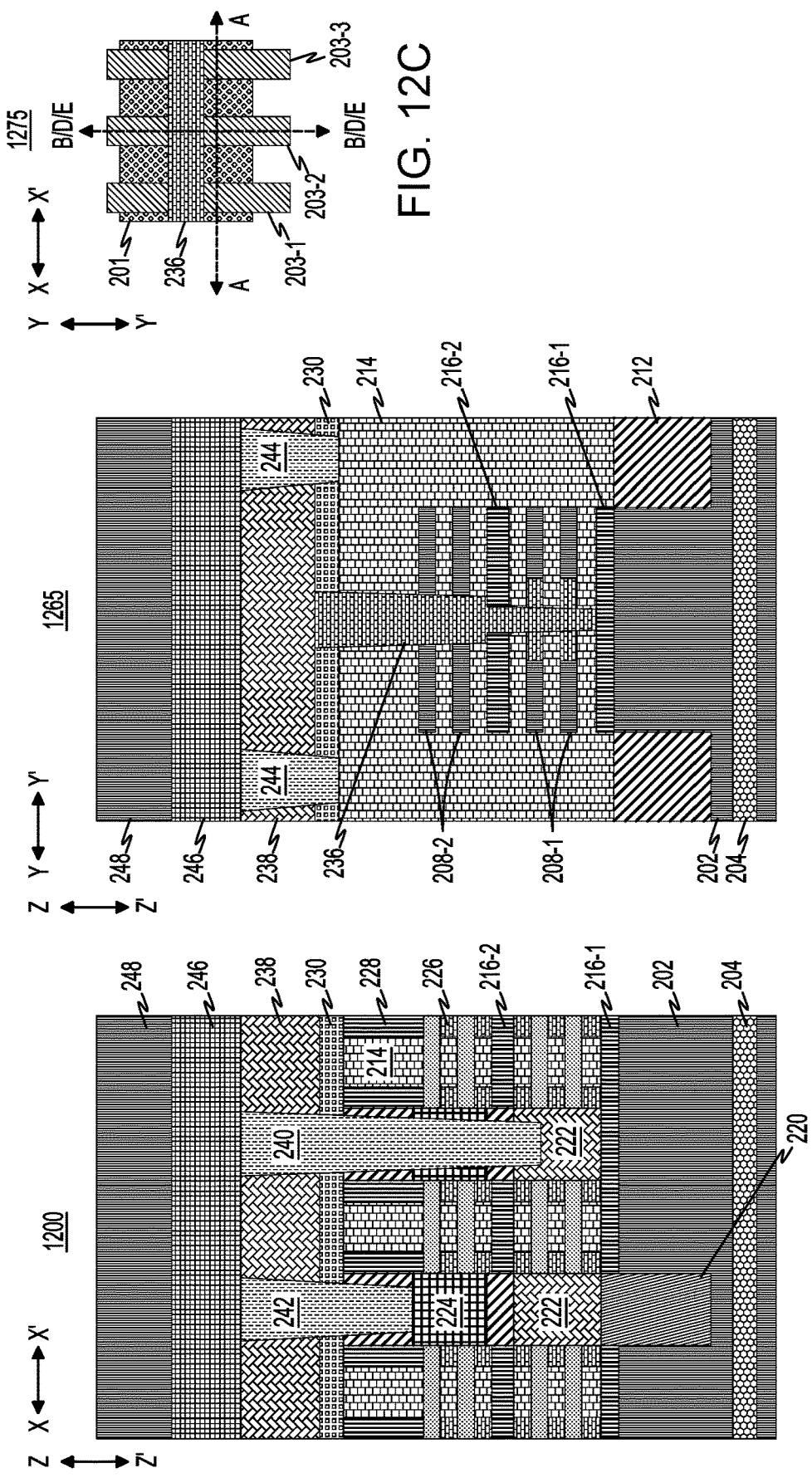

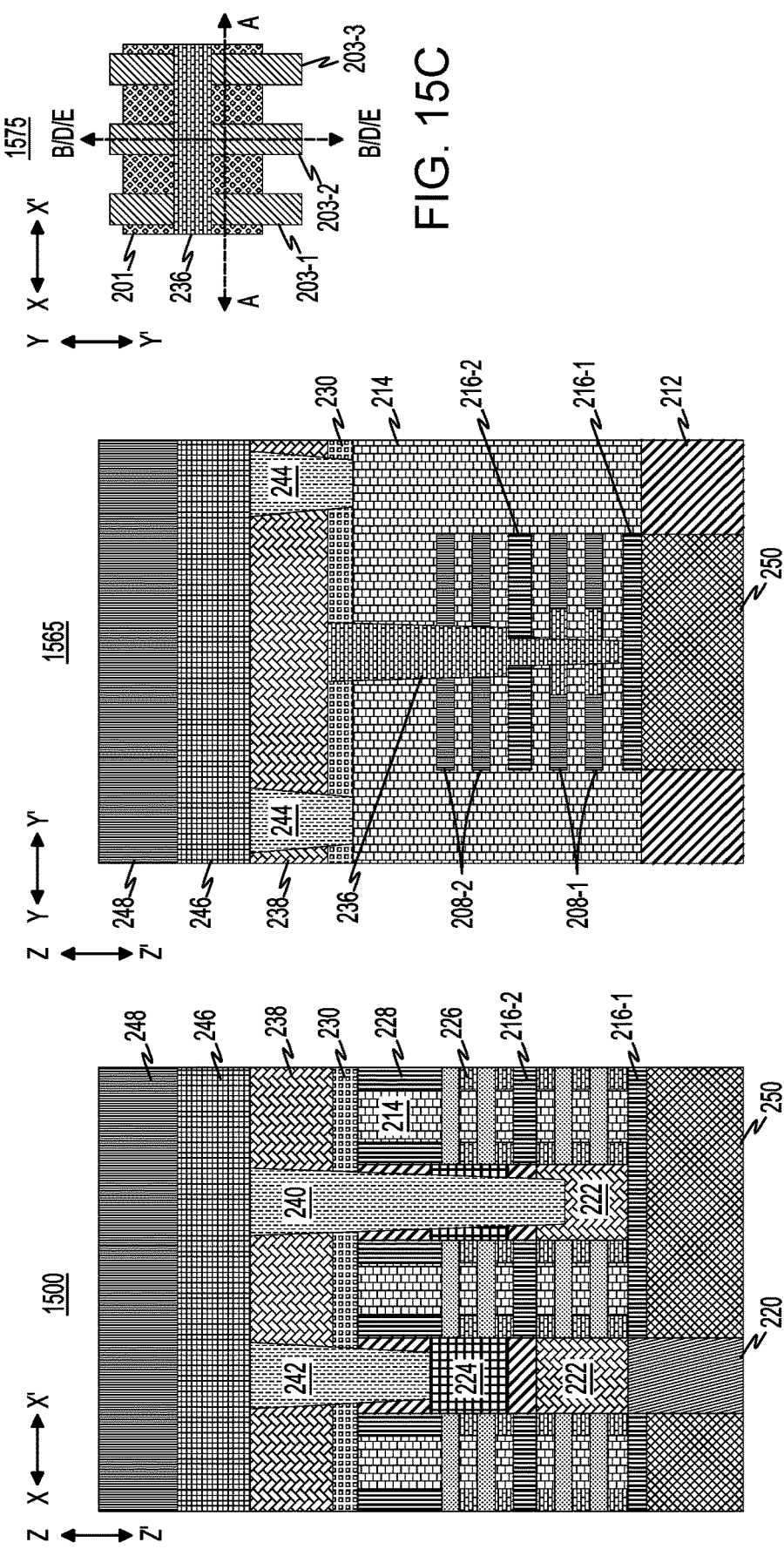

ISOLATION PILLAR STRUCTURES FOR STACKED DEVICE STRUCTURES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves removing sacrificial layers, which may be formed of silicon germanium (SiGe), between sheets of channel material, which may be formed of silicon (Si).

For continued scaling (e.g., to 2.5 nm and beyond), next-generation complementary FET (CFET) devices may be used. CFET devices provide a complex gate-all-around (GAA) structure. Conventional GAA FETs, such as nanosheet FETs, may stack multiple p-type nanowires or nanosheets on top of each other in one device, and may stack multiple n-type nanowires or nanosheets on top of each other in another device. CFET structures provide improved track height scaling, leading to structural gains (e.g., such as 30-40% structural gains for different types of devices, such as logic devices, static random-access memory (SRAM) devices, etc.). In CFET structures, n-type and p-type nanowires or nanosheets are stacked on each other, eliminating n-to-p separation bottlenecks and reducing the device area footprint. There is, however, a continued to desire for further scaling and reducing the size of FETs.

SUMMARY

Embodiments of the invention provide techniques for forming isolation pillar structures having varying widths to separate and control channel widths of devices in stacked device structures.

In one embodiment, a microelectronic structure comprises a first stacked device structure comprising a first upper device and a first lower device, a second stacked device structure comprising a second upper device and a second lower device, and an isolation pillar structure located between the first and second stacked device structures. The isolation pillar structure has an upper section contacting the first and second upper devices and a lower section contacting the first and second lower devices. The upper section of the isolation pillar structure has a first width and the lower section of the isolation pillar structure has a second width different than the first width. The isolation pillar structure advantageously enables the first and second stacked device structures to be formed closer to one another, and the varying width of the isolation pillar structure advantageously enables control of widths of devices in the first and second stacked device structures which are separated by the isolation pillar structure.

One of the first upper device and the first lower device in the first stacked device structure may comprise an nFET device and the other one of the first upper device and the second lower device in the first stacked device structure may comprises a pFET device. The first width of the upper section of the isolation pillar and the second width of the lower section of the isolation pillar controls a ratio of an n-type active area size of the nFET device to a p-type active area size of the pFET device.

In another embodiment, a microelectronic structure comprises a first stacked field-effect transistor structure comprising a first lower field-effect transistor device and a first upper field-effect transistor device, a second stacked field-effect transistor structure comprising a second lower field-effect transistor device and a second upper field-effect transistor device, and an isolation pillar structure between the first stacked field-effect transistor structure and the second stacked field-effect transistor structure, the isolation pillar structure having an upper section with a first width and a lower section with a second width different than the first width. The isolation pillar structure advantageously enables the first and second stacked field-effect transistor structures to be formed closer to one another, and the varying width of the isolation pillar structure advantageously enables control of widths of channels of the upper and lower field-effect transistor devices in the first and second stacked field-effect transistor structures which are separated by the isolation pillar structure.

The upper section of the isolation pillar structure may contact channels of the first and second upper FET devices in the first and second stacked FET structures, and the lower section of the isolation pillar structure may contact channels of the first and second lower FET devices in the first and second stacked FET structures. The isolation pillar structure may separate channels, gates and source/drain regions of the first and second upper and lower FET devices in the first and second stacked FET structures.

The first width of the upper section of the isolation pillar structure may be greater than the second width of the lower section of the isolation pillar structure.

The isolation pillar structure may further comprise extension sections that extend outwards from the lower section towards indents in channels of the first and second lower FET devices in the first and second stacked FET structures.

In another embodiment, an integrated circuit comprises a complementary field-effect transistor structure comprising a first stacked field-effect transistor structure comprising a first lower field-effect transistor device and a first upper field-effect transistor device, a second stacked field-effect transistor structure comprising a second lower field-effect transistor device and a second upper field-effect transistor device, and an isolation pillar structure between the first stacked field-effect transistor structure and the second stacked field-effect transistor structure, the isolation pillar structure having an upper section with a first width and a lower section with a second width different than the first width. The isolation pillar structure advantageously enables the first and second stacked field-effect transistor structures in the complementary field-effect transistor structure to be formed closer to one another, and the varying width of the isolation pillar structure advantageously enables control of widths of channels of the upper and lower field-effect transistor devices in the first and second stacked field-effect transistor structures which are separated by the isolation pillar structure.

The upper section of the isolation pillar structure may contact channels of the first and second upper FET devices in the first and second stacked FET structures, and the lower section of the isolation pillar structure may contact channels of the first and second lower FET devices in the first and second stacked FET structures.

In another embodiment, a microelectronic structure comprises two or more stacked field-effect transistor structures, each of the two or more stacked field-effect transistor structures comprising two or more field-effect transistor devices stacked over one another, and an isolation pillar structure separating first and second ones of the two or more stacked field-effect transistor structures. The isolation pillar structure comprises a first section contacting channels of at least first ones of the two or more field-effect transistor devices in the first and second ones of the two or more stacked field-effect transistor structures and a second section contacting channels of at least second ones of the two or more field-effect transistor devices in the first and second ones of the two or more stacked field-effect transistor structures. The first section of the isolation pillar structure has a first width and the second section of the isolation pillar structure has a second width different than the first width. The isolation pillar structure advantageously enables the first and second ones of the two or more stacked field-effect transistor structures to be formed closer to one another, and the varying width of the isolation pillar structure advantageously enables control of widths of channels of the upper and lower field-effect transistor devices in the first and second ones of the two or more stacked field-effect transistor structures which are separated by the isolation pillar structure.

The first ones of the two or more FET devices may comprise nFET devices and the second ones of the two or more FET devices may comprise pFET devices. The first width of the isolation pillar structure may define a first active region area of the nFET devices and the second width of the isolation pillar may define a second active region area of the pFET devices.

The microelectronic structure may further comprise an additional isolation pillar structure separating third and fourth ones of the two or more stacked FET structures, wherein the additional isolation pillar structure comprises a first section contacting channels of at least first ones of the two or more FET devices in the third and fourth stacked FET structures and a second section contacting channels of at least second ones of the two or more FET devices in the third and fourth stacked FET structures, wherein the first section of the additional isolation pillar structure has a third width and the second section of the isolation pillar structure has a fourth width different than the third width, and wherein at least one of the third width is different than the first width and the fourth width is different than the second width.

In another embodiment, a method comprises forming first and second stacked field-effect transistor device structures, each of the first and second stacked field-effect transistor device structures comprising an upper field-effect transistor device and a lower field-effect transistor device, wherein the upper field-effect transistor devices of the first and second stacked field-effect transistor device structures have merged channels, and wherein lower field-effect transistor devices of the first and second stacked field-effect transistor device structures have merged channels. The method also comprises forming an isolation pillar structure between the first and second stacked field-effect transistor structures, the isolation pillar structure comprising an upper section with a first width that separates the merged channels of the upper field-effect transistor devices of the first and second stacked field-effect transistor device structures and a lower section with a second width different than the first width that separate the merged channels of the lower field-effect transistor devices of the first and second stacked field-effect transistor device structures. The isolation pillar structure advantageously enables the first and second stacked field-effect transistor structures to be formed closer to one another, and the varying width of the isolation pillar structure advantageously enables control of widths of channels of the upper and lower field-effect transistor devices in the first and second stacked field-effect transistor structures which are separated by the isolation pillar structure.

Forming the isolation pillar structure may comprise performing a first cut process that etches through the merged channels of the upper FET devices of the first and second stacked FET device structures, the first cut process stopping on a middle dielectric isolation layer disposed between the upper FET devices and the lower FET devices of the first and second stacked FET device structures, forming a protection spacer on exposed sidewalls of the channels of the upper FET devices of the first and second stacked FET device structures, and performing a second cut process that etches through the merged channels of the lower FET devices of the first and second stacked FET device structures, the second cut process stopping on a bottom dielectric isolation layer disposed below the lower FET devices of the first and second stacked FET device structures.

Forming the isolation pillar structure may further comprise performing an indent etch that removes portions of the channels of the lower FET devices.

Forming the isolation pillar structure may further comprise removing the protection spacer, and filling a dielectric material in spaces exposed by the first cut process, the second cut process, and the indent etch. The indent etch controls a ratio of a lower active region area of the lower FET devices to an upper active region area of the upper FET devices. The lower FET devices may comprise one of nFET devices and pFET devices, and the upper FET devices may comprise the other one of nFET devices and pFET devices.

These and other features and advantages of embodiments described herein will become more apparent from the accompanying drawings and the following detailed description.

BRIEF DESCRIPTION OF THE DRAWINGS

FIG. 2A depicts a first side cross-sectional view of a structure following formation of nanosheet channels over a substrate, according to an embodiment of the invention.

FIG. 2B depicts a second side cross-sectional view of a structure following formation of nanosheet channels over a substrate, according to an embodiment of the invention.

FIG. 2C depicts a top-down view of a structure following formation of nanosheet channels over a substrate, according to an embodiment of the invention.

FIG. 6A depicts a first side cross-sectional view of the structure of FIGS. 5A-5E following formation of a protection spacer for the first set of the nanosheets, according to an embodiment of the invention.

FIG. 6B depicts a second side cross-sectional view of the structure of FIGS. 5A-5E following the formation of the protection spacer for the first set of the nanosheets, according to an embodiment of the invention.

FIG. 6C depicts a top-down view of the structure of FIGS. 5A-5E following the formation of the protection spacer for the first set of the nanosheets, according to an embodiment of the invention.

FIG. 12A depicts a first side cross-sectional view of the structure of FIGS. 11A-11E following formation of middle-of-line contacts and back-end-of-line interconnects and following bonding of the structure to a carrier wafer, according to an embodiment of the invention.

FIG. 12B depicts a second side cross-sectional view of the structure of FIGS. 11A-11E following the formation of the middle-of-line contacts and the back-end-of-line interconnects and following the bonding of the structure to the carrier wafer, according to an embodiment of the invention.

FIG. 12C depicts a top-down view of the structure of FIGS. 11A-11E following the formation of the middle-of-line contacts and the back-end-of-line interconnects and following the bonding of the structure to the carrier wafer, according to an embodiment of the invention.

FIG. 15A depicts a first side cross-sectional view of the structure of FIGS. 14A-14E following deposition and planarization of an interlayer dielectric on the back side of the structure, according to an embodiment of the invention.

FIG. 15B depicts a second side cross-sectional view of the structure of FIGS. 14A-14E following the deposition and planarization of the interlayer dielectric on the back side of the structure, according to an embodiment of the invention.

FIG. 15C depicts a top-down view of the structure of FIGS. 14A-14E following the deposition and planarization of the interlayer dielectric on the back side of the structure, according to an embodiment of the invention.

DETAILED DESCRIPTION

Illustrative embodiments of the invention may be described herein in the context of illustrative methods for forming isolation pillar structures having varying widths to separate and control channel widths of devices in stacked device structures, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

As discussed above, various techniques may be used to reduce the size of FETs, including through the use of fin-shaped channels in FinFET devices, through the use of stacked nanosheet channels formed over a semiconductor substrate, and next-generation CFET devices.

Figure 1A:
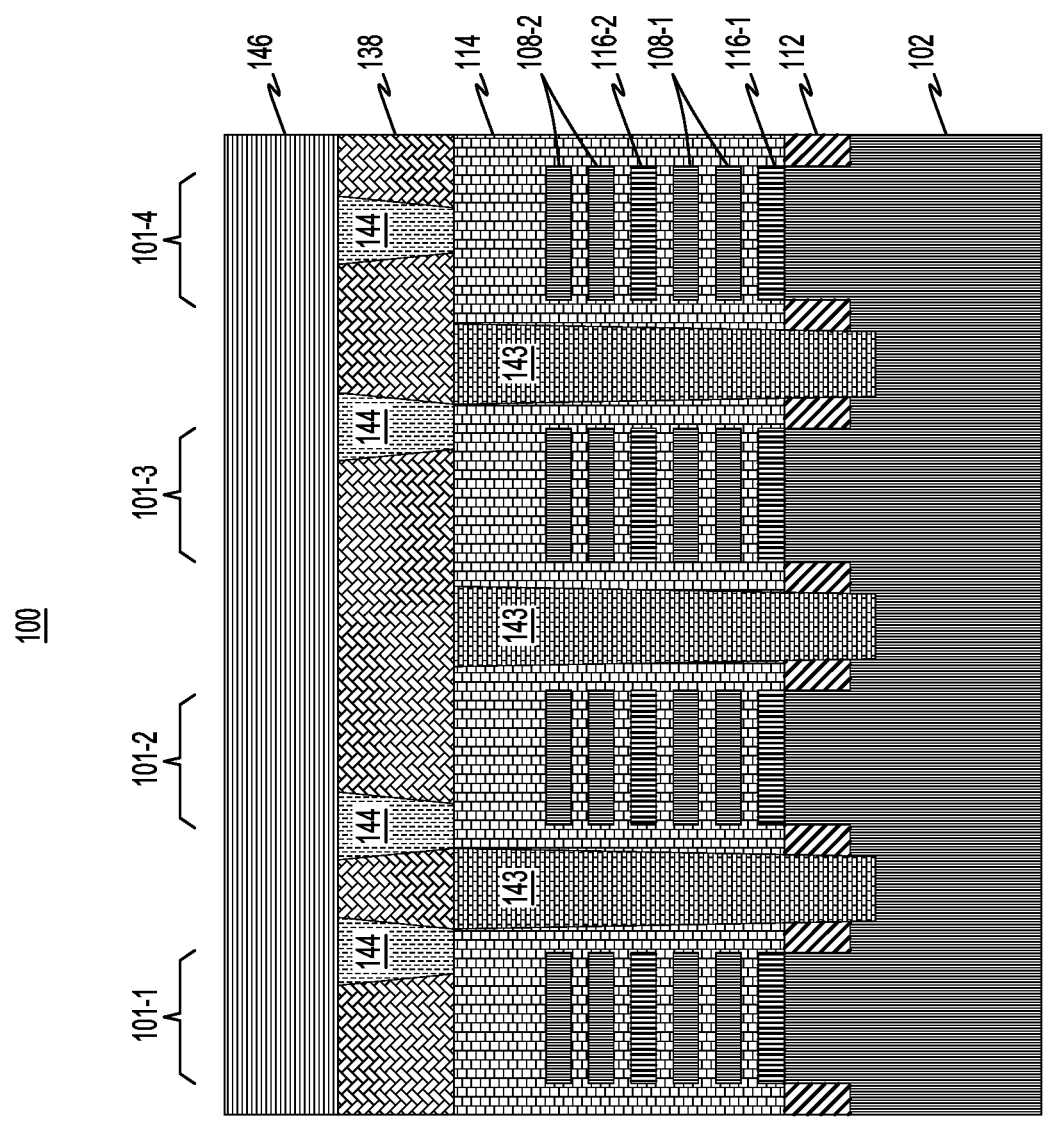
FIG. 1A depicts a side cross-sectional view of a complementary field-effect transistor structure, according to an embodiment of the invention.
Figure 1B:
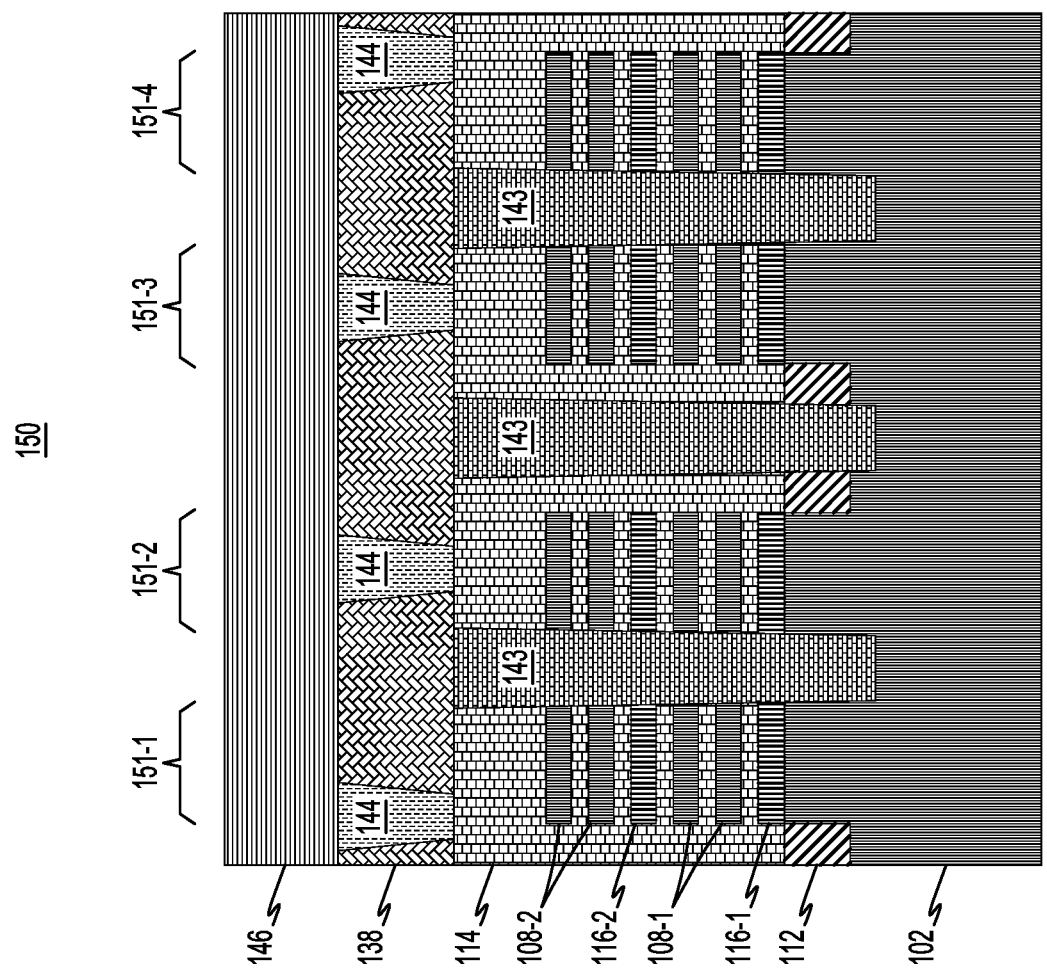
FIG. 1B depicts a side cross-sectional view of another complementary field-effect transistor structure, according to an embodiment of the invention.

FIG. 1A shows a cross-sectional view 100 of a set of conventional CFET cells 101-1, 101-2, 101-3 and 101-4 (collectively, CFET cells 101), and FIG. 1B shows a cross-sectional view 150 of a set of scaled CFET cells 151-1, 151-2, 151-3 and 151-4 (collectively, scaled CFET 151), with removal of gate extension from one of the two nanosheet tips, where the scaled CFET 151 may also be referred to as CFET 2 cells 151). The structures of FIGS. 1A and 1B include respective substrates 102, shallow trench isolation (STI) regions 112, bottom dielectric insulator (BDI) layers 116-1, bottom nanosheet channels 108-1, middle dielectric insulator (MDI) layers 116-2, top nanosheet channels 108-2, gates 114, interlayer dielectric (ILD) layers 138, gate cuts 143, gate contacts 144, and topside back-end-of-line (BEOL) interconnects 146. As illustrated, the CFET 2 cells 151 provide improved overall scaling than the CFET cells 101 by removing one gate extension per CMOS cell.

Illustrative embodiments provide novel methods and structure for enabling flexible n-to-p ratios for CFET 2 cells through controlling the respective widths of n-type and p-type nanosheet channels which are stacked over one another in the CFET 2 cells. Microelectronic and semiconductor structures are provided, which include stacked FETs (e.g., with one FET over another FET, such as pFET over nFET, or nFET over pFET). Pairs of the stacked cells are located close to one another (e.g., providing CFET 2 cells), where nanosheet channels, gates, and source/drain regions (e.g., source/drain epitaxial layers) are separated by a dielectric pillar. In the stacked FETs, flexible ratios are provided, including: a smaller top active area size than bottom active area size (e.g., wider top nanosheet channels than bottom nanosheet channels); a larger top active area size than bottom active area size (e.g., wider bottom nanosheet channels than top nanosheet channels), or equal-sized top and bottom active area size (e.g., top and bottom nanosheet channels with the same width). The dielectric pillar may include a fork-like bottom shape for the configuration where the top active area size is larger than the bottom active area size.

Microelectronic and other semiconductor structures with flexible n-to-p ratios may be formed using the following processing. Two CFET stacked cells (e.g., a CFET 2 cell) are formed close to one another, where the channels, gates and source/drain regions are merged in the beginning. A first cut process is used to etch through the top channels, top gates, and top source/drain regions, stopping on a MDI layer. A top channel protection spacer is then formed, followed by a second cut process to etch through the MDI layer, the bottom channels, bottom gates and bottom source/drain regions, stopping on a BDI layer. Optionally, additional indentation of the bottom channels is performed (e.g., to adjust the relative size of the top and bottom active regions). The top channel protection spacer is then removed, followed by filling the first and second cut regions (and any optional indentations of the bottom channels) with dielectric material or a dielectric pillar.

FIGS. 2A-17E show a process flow for forming CFET 2 cells with flexible n-to-p ratios for the n-type and p-type nanosheet channels.

FIG. 2A shows a first side cross-sectional view 200 of a structure, following formation of nanosheet channel layers 208-1 and 208-2 over a substrate 202. FIG. 2B shows a second side cross-sectional view 265 of the structure, and FIG. 2C shows a top-down view 275 of the structure. The top-down view 275 of FIG. 2C shows an active region 201 where gate structures 203-1, 203-2 and 203-3 will be formed. The first side cross-sectional view 200 of FIG. 2A is taken along the line A-A in the top-down view 275 (e.g., across the gate structures 203-1, 203-2 and 203-3), and the second side cross-sectional view 265 of FIG. 2B is taken along the line B-B in the top-down view 275 (e.g., along the gate structure 203-2).

The substrate 202 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

An etch stop layer 204 is formed in the substrate 202. The etch stop layer 204 may comprise a buried oxide (BOX) layer or silicon germanium (SiGe), or another suitable material such as a III-V semiconductor epitaxial layer. The etch stop layer 204 may have a height (in direction Z-Z') in the range of 10 to 30 nm.

Nanosheets are formed over the substrate 202, where the nanosheets include sacrificial layers 206-1 and 206-2 (collectively, sacrificial layers 206), nanosheet channel layers 208-1 and 208-2 (collectively, nanosheet channel layers 208), and sacrificial layers 210-1 and 210-2 (collectively, sacrificial layers 210).

The sacrificial layers 206 and sacrificial layers 210 are illustratively formed of different sacrificial materials, such that they may be etched or otherwise removed selective to one another. In some embodiments, both the sacrificial layers 206 and sacrificial layers 210 are formed of SiGe, but with different percentages of Ge. For example, the sacrificial layers 206 may have a relatively higher percentage of Ge (e.g., 55% Ge), and the sacrificial layers 210 may have a relatively lower percentage of Ge (e.g., 25% Ge). Other combinations of different sacrificial materials may be used in other embodiments. The sacrificial layers 206 and 210 may each have a thickness (in direction Z-Z') in the range of 6-15 nm.

The nanosheet channel layers 208 may be formed of Si or another suitable material (e.g., a material similar to that used for the substrate 202). Each of the nanosheet channel layers 208 may have a thickness (in direction Z-Z') in the range of 4-10 nm.

Figure 3A:
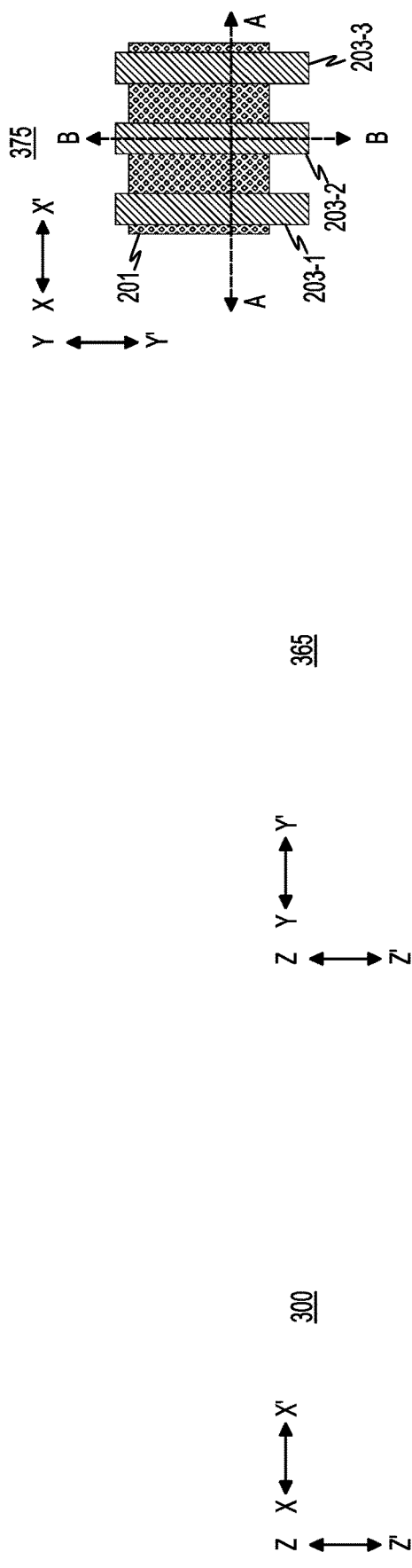
FIG. 3A depicts a first side cross-sectional view of the structure of FIGS. 2A-2C following nanosheet patterning and formation of shallow trench isolation regions, according to an embodiment of the invention.
Figure 3B:
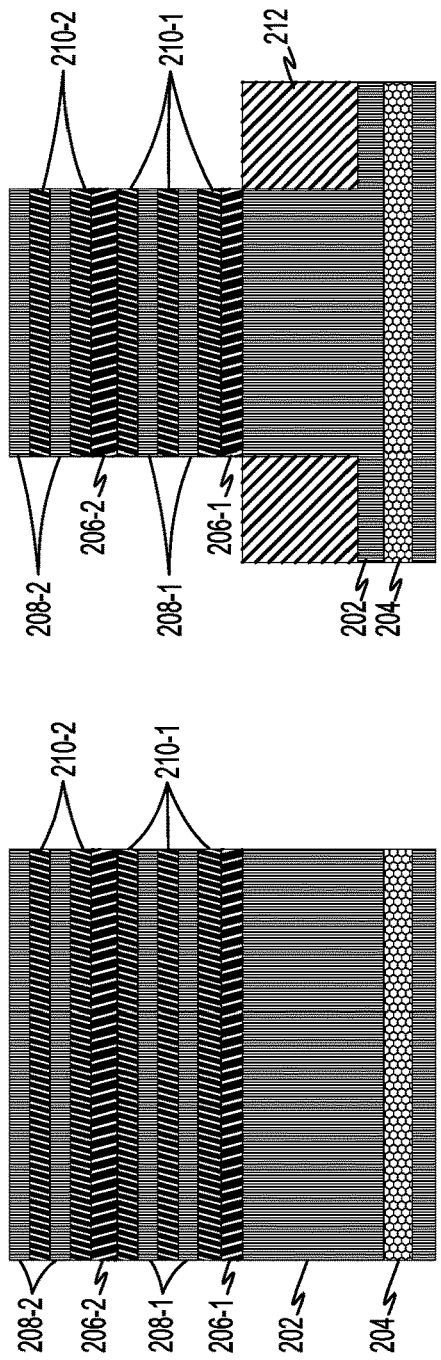
FIG. 3B depicts a second side cross-sectional view of the structure of FIGS. 2A-2C following the nanosheet patterning and formation of the shallow trench isolation regions, according to an embodiment of the invention.
Figure 3C:
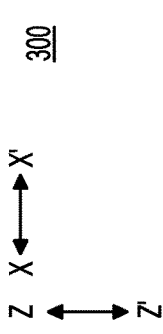
FIG. 3C depicts a top-down view of the structure of FIGS. 2A-2C following the nanosheet patterning and formation of the shallow trench isolation regions, according to an embodiment of the invention.

FIG. 3A shows a first side cross-sectional view 300 of the structure of FIGS. 2A-2C following nanosheet patterning and formation of STI regions 212. FIG. 3B shows a second side cross-sectional view 365 of the structure of FIGS. 2A-2C following the nanosheet patterning and the formation of the STI regions 212. FIG. 3C shows a top-down view 375 of the structure of FIGS. 2A-2C following the nanosheet patterning and the formation of the STI regions 212. The first side cross-sectional view 300 of FIG. 3A is taken along the line A-A in the top-down view 375, and the second side cross-sectional view 365 of FIG. 3B is taken along the line B-B in the top-down view 375.

The STI regions 212 may be formed by patterning a masking layer over the structure of FIGS. 2A-2C, followed by etching exposed portions of the sacrificial layers 210, the nanosheet channel layers 208, and through a portion of the substrate 202 as illustrated in FIGS. 3A and 3B. The STI regions 212 may be formed of a dielectric material such as silicon dioxide ($SiO_2$), silicon oxycarbide (SiOC), silicon oxynitride (SiON), etc. The STI regions 212 may have a height (in direction Z-Z') in the range of 20 to 100 nm.

Figure 4C:
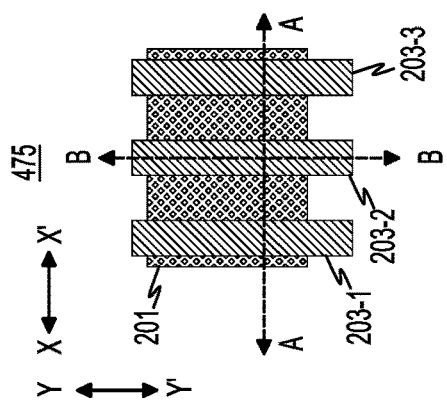
FIG. 4C depicts a top-down view of the structure of FIGS. 3A-3C following the formation of the source/drain regions and the gate structures, according to an embodiment of the invention.
Figure 4B:
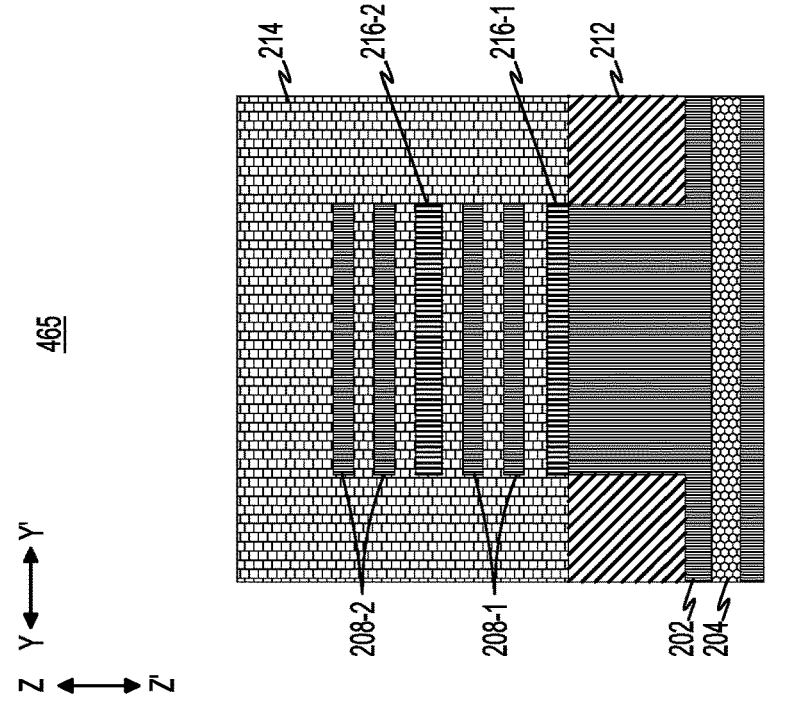
FIG. 4B depicts a second side cross-sectional view of the structure of FIGS. 3A-3C following the formation of the source/drain regions and the gate structures, according to an embodiment of the invention.
Figure 4A:
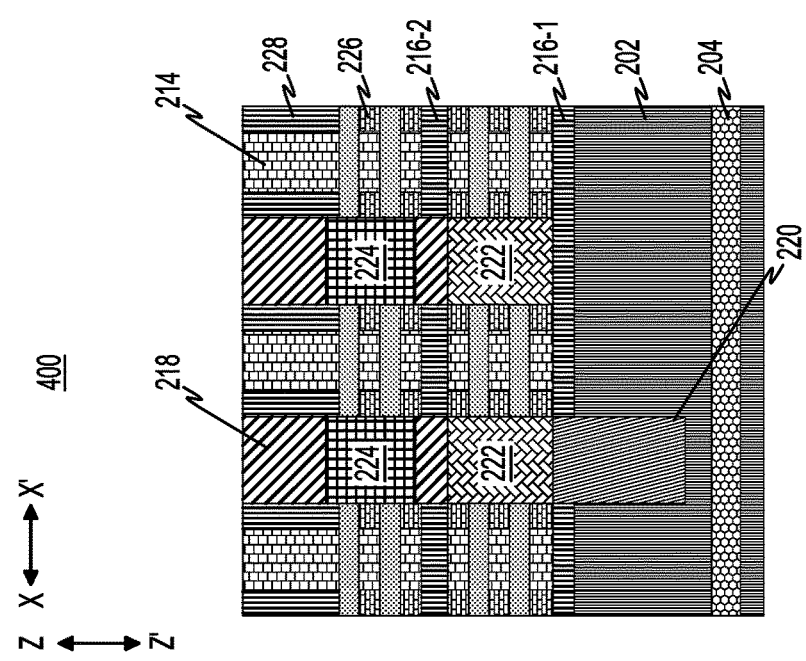
FIG. 4A depicts a first side cross-sectional view of the structure of FIGS. 3A-3C following formation of source/drain regions and gate structures, according to an embodiment of the invention.

FIG. 4A shows a first side cross-sectional view 400 of the structure of FIGS. 3A-3C following formation of stacked FET structures. FIG. 4B shows a second side cross-sectional view 465 of the structure of FIGS. 3A-3C following the formation of the stacked FET structures. FIG. 4C shows a top-down view 475 of the structure of FIGS. 3A-3C following the formation of the stacked FET structures. The first side cross-sectional view 400 of FIG. 4A is taken along the line A-A in the top-down view 475, and the second side cross-sectional view 465 of FIG. 4B is taken along the line B-B in the top-down view 475.

The stacked FET structure includes a gate stack layer 214, a BDI layer 216-1, an MDI layer 216-2, an ILD layer 218, a sacrificial placeholder layer 220, bottom source/drain regions 222, top source/drain regions 224, inner spacers 226, and sidewall spacers 228. To form the structure shown in FIGS. 4A and 4B, dummy gates are first formed over the nanosheets. Next, the sacrificial layers 206-1 and 206-2 are selectively removed, followed by sidewall spacer 228, MDI layer 216-2, and BDI layer 216-1 formation by conformal dielectric liner deposition and anisotropic dielectric liner etching. After that, the exposed nanosheet stack and portions of the MDI layer 216-2 that are not covered by the dummy gates or sidewall spacer 228 are recessed, followed by indentation of the sacrificial layers 210-1 and 210-2 and formation of inner spacer 226. Next, a backside contact patterning is used to form a trench through the BDI layer 216-1 into the substrate 202, followed by filling the trench with sacrificial materials to form bottom the sacrificial placeholder layer 220. After that, the bottom source/drain regions 222, top source/drain regions 224 and ILD layer 218 are formed, followed by poly open CMP to reveal the dummy gates. The dummy gates and sacrificial layers 210-1 and 210-2 are removed, followed by formation of the gate stack layer 214 (e.g., using replacement HKMG processing).

The gate stack layer 214 may comprise a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide (LaAlO$_3$), zirconium oxide (ZrO$_2$), zirconium silicon oxide, zirconium silicon oxynitride, tantalum oxide (Ta$_2$O$_5$), titanium oxide (TiO$_2$), barium strontium titanium oxide, barium titanium oxide, strontium titanium oxide, yttrium oxide (Y$_2$O$_3$), aluminum oxide (Al$_2$O$_3$), lead scandium tantalum oxide, and lead zinc niobate. The high-k material may further include dopants such as lanthanum (La), aluminum (Al), and magnesium (Mg). The gate dielectric layer may have a uniform thickness in the range of 1 nm to 3 nm.

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

The BDI layer 216-1 and MDI layer 216-2 (collectively, dielectric insulator layers 216) may be formed of any suitable insulator, such as SiN, silicon boron carbide nitride (SiBCN), silicon oxycarbonitride (SiOCN), etc. The BDI layer 216-1 is formed in the region previously occupied by the sacrificial layer 206-1, and the MDI layer 216-2 is formed in the region previously occupied by the sacrificial layer 206-2, and may have similar sizing as the sacrificial layers 206-1 and 206-2.

The ILD layer 218 is formed between the bottom source/drain regions 222 and the top source/drain regions 224, and over the top of the top source/drain regions 224. The ILD layer 218 may be formed of any suitable isolating material, such as SiO$_2$, SiOC, SiON, etc. The ILD layer 218 has a width (in direction X-X') which matches that of the bottom source/drain regions 222 and the top source/drain regions 224. The sacrificial placeholder layer 220 is formed below the bottom source/drain regions 222, and may be formed of a sacrificial material or materials, such as SiGe, titanium oxide (TiO$_x$), aluminum oxide (AlO$_x$), silicon carbide (SiC), etc. The sacrificial placeholder layer has a width (in direction X-X') that also matches that of the bottom source/drain regions 222 and the top source/drain regions 224. A mask layer may be patterned over the structure, followed by etching through underlying layers into the substrate 202. The sacrificial placeholder layer 220 may then be deposited, followed by epitaxial growth of the bottom source/drain regions 222, deposition and planarization of the portion of the ILD layer 218 that is between the bottom source/drain regions 222 and the top source/drain regions 224, followed by epitaxial growth of the top source/drain regions 224 and deposition and planarization of the portion of the ILD layer 218 that is over the top source/drain regions 224.

The bottom source/drain regions 222 and the top source/drain regions 224, as noted above, may be formed using epitaxial growth processes, and thus may also be referred to as bottom epitaxial layers 222 and top epitaxial layers 224. The bottom source/drain regions 222 and the top source/drain regions 224 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF$_2$), gallium (Ga), indium (In), and thallium (Tl). The bottom source/drain regions 222 and the top source/drain regions 224 may be formed using epitaxial growth processes. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$. The bottom source/drain regions 222 and the top source/drain regions 224 may have a width (in direction X-X') in the range of 10 to 30 nm.

The inner spacers 226 may be formed to fill indent spaces (e.g., resulting from indent etches of the sacrificial layers 210 prior to their removal). The inner spacers 226 may be formed of silicon nitride (SiN) or another suitable material such as SiBCN, silicon carbide oxide (SiCO), SiOCN, etc. The inner spacers 226 may have widths (in direction X-X') in the range of 2-10 nm, and may have heights (in direction Z-Z') matching that of the sacrificial layers 210.

The sidewall spacers 228 may be formed of materials similar to that of the dielectric insulator layers 216. The sidewall spacers 228 may have widths (in direction X-X') that are similar to the widths of the inner spacers 226.

Figure 5C:
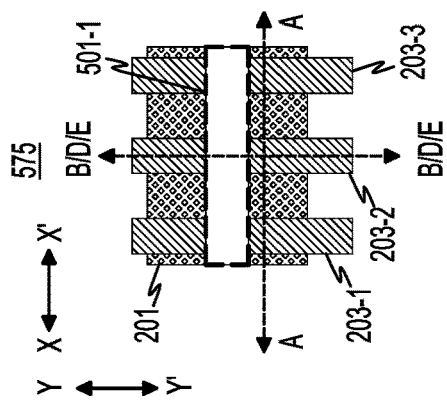
FIG. 5C depicts a top-down view of the structure of FIGS. 4A-4C following the patterning of the hard mask layer and the cut of the first set of the nanosheets, according to an embodiment of the invention.
Figure 5B:
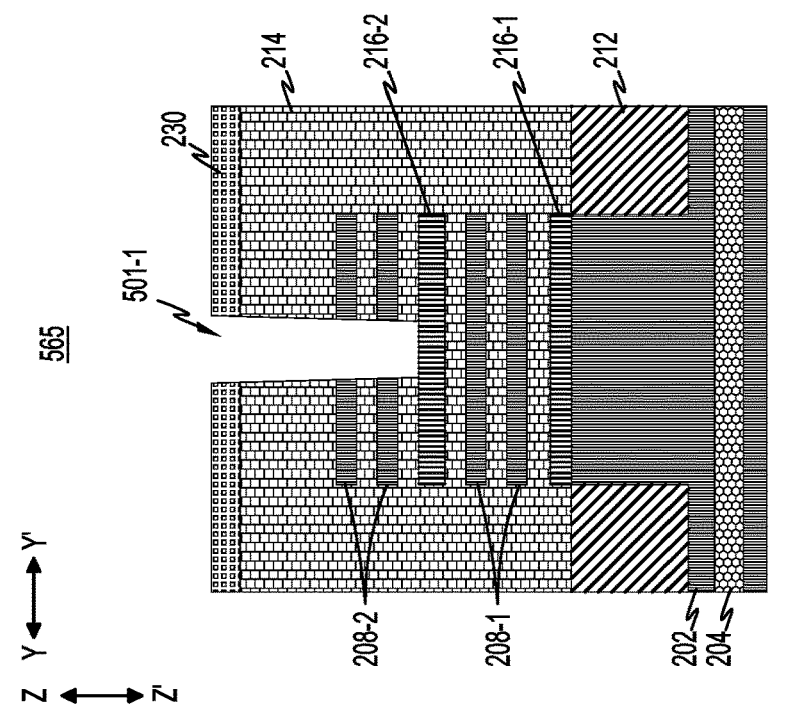
FIG. 5B depicts a second side cross-sectional view of the structure of FIGS. 4A-4C following the patterning of the hard mask layer and the cut of the first set of the nanosheets, according to an embodiment of the invention.
Figure 5A:
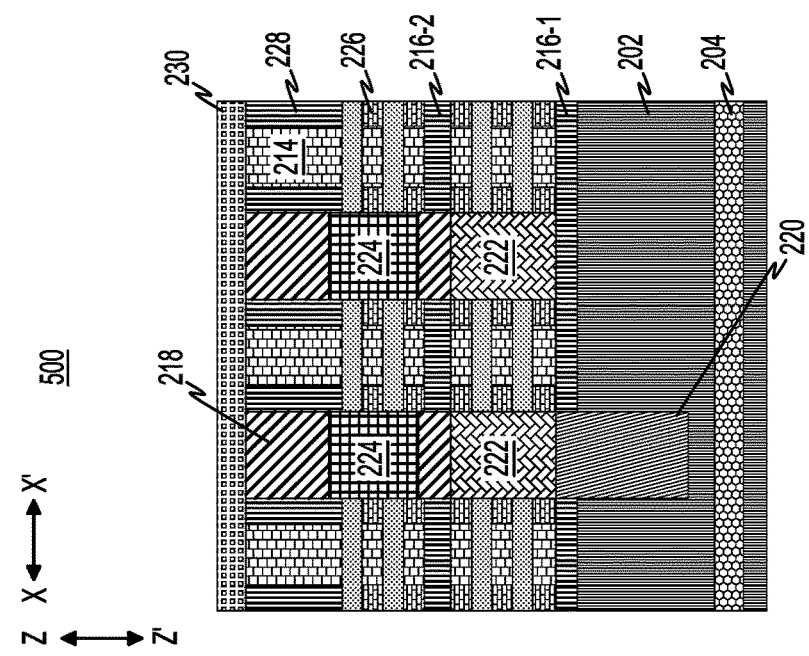
FIG. 5A depicts a first side cross-sectional view of the structure of FIGS. 4A-4C following patterning of a hard mask layer and performing a cut of a first set of the nanosheets, according to an embodiment of the invention.
Figures 5D, 5E:
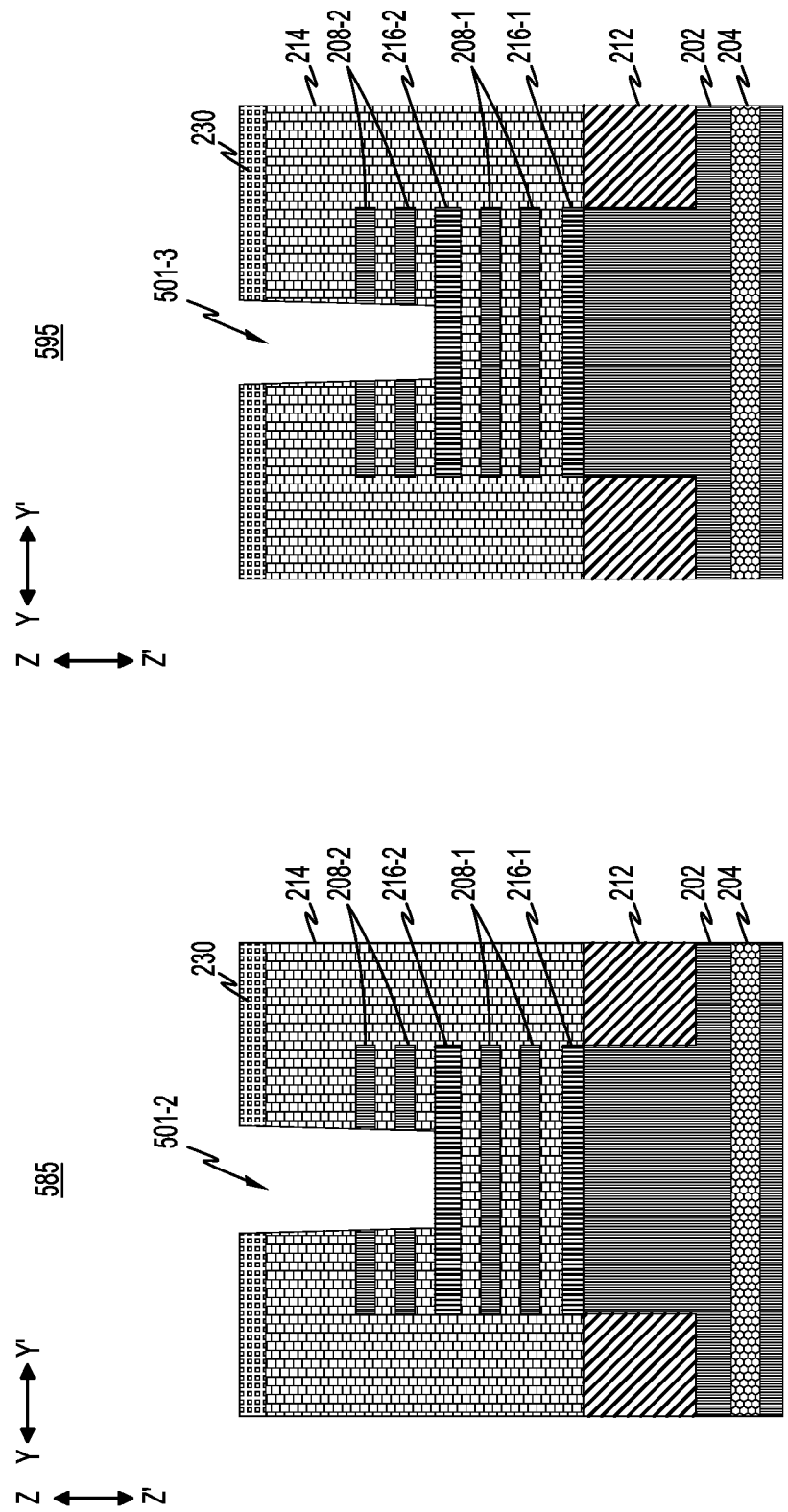
FIG. 5D depicts a third side cross-sectional view of the structure of FIGS. 4A-4C following the patterning of the hard mask layer and performing an alternate cut of the first set of nanosheets, according to an embodiment of the invention.
FIG. 5E depicts a fourth side cross-sectional view of the structure of FIGS. 4A-4C following the patterning of the hard mask layer and performing another alternate cut of the first set of nanosheets, according to an embodiment of the invention.

FIG. 5A shows a first side cross-sectional view 500 of the structure of FIGS. 4A-4C following patterning of a hard mask (HM) layer 230 and performing cut patterning of the nanosheet channel layers 208-2. FIG. 5B shows a second side cross-sectional view 565 of the structure of FIGS. 4A-4C following the patterning of the HM layer 230 and the cut patterning of the nanosheet channel layers 208-2. FIG. 5C shows a top-down view 575 of the structure of FIGS. 4A-4C following the patterning of the HM layer 230 and the cut patterning of the nanosheet channel layers 208-2. FIG. 5D shows a third side cross-sectional view 585 of the structure of FIGS. 4A-4C following the patterning of the HM layer 230 and alternate cut patterning of the nanosheet channel layers 208-2. FIG. 5E shows a fourth side cross-sectional view 595 of the structure of FIGS. 4A-4C following the patterning of the HM layer 230 and another alternate cut patterning of the nanosheet channel layers 208-2. The first side cross-sectional view 500 of FIG. 5A is taken along the line A-A in the top-down view 575, while the second, third and fourth side cross-sectional views 565, 585 and 595 of FIGS. 5B, 5D and 5E are taken along the line B/D/E-B/D/E in the top-down view 575.

As noted above, illustrative embodiments enable flexibility in n-to-p ratios through controlling the widths of the nanosheet channel layers 208-1 and 208-2, where (i) the nanosheet channel layers 208-1 may be narrower than the nanosheet channel layers 208-2, (ii) the nanosheet channel layers 208-1 may be wider than the nanosheet channel layers 208-2, or (iii) the nanosheet channel layers 208-1 may be substantially the same width as the nanosheet channel layers 208-2. These three cases are illustrated in the different processing shown in FIGS. 5B, 5D and 5E (and subsequent similarly-lettered B, D and E figures). More particularly, the processing shown in FIG. 5B (and subsequently in FIGS. 6B, 7B, 8B, 9B, 10B, 11B, 12B, 13B, 14B, 15B, 16B and 17B) show processing for case (i) where the nanosheet channel layers 208-1 are formed to be narrower than the nanosheet channel layers 208-2. The processing shown in FIG. 5D (and subsequently in FIGS. 6D, 7D, 8D, 9D, 10D, 11D, 12D, 13D, 14D, 15D, 16D and 17D) show processing for case (ii) where the nanosheet channel layers 208-1 are formed to be wider than the nanosheet channel layers 208-2. The processing shown in FIG. 5E (and subsequently in FIGS. 6E, 7E, 8E, 9E, 10E, 11E, 12E, 13E, 14E, 15E, 16E and 17E) show processing for case (iii) where the nanosheet channel layers 208-1 are formed to be substantially the same width as the nanosheet channel layers 208-2.

It should be appreciated that the processing shown in FIGS. 5B, 5D and 5E (and subsequent similarly-lettered B, D and E figures) may be performed for the same structure, such as where the different processing of FIGS. 5B, 5D and 5E (and subsequent similarly-lettered B, D and E figures) is used for different portions of the structure. While for clarity of illustration only one B/D/E-B/D/E line along the gate structure 203-2 is shown in the top-down view 575 of FIG. 5C (and similarly in top-down views of FIGS. 6C, 7C, 8C, 9C, 10C, 11C, 12C, 13C, 14C, 15C, 16C and 17C), the different processing of FIGS. 5B, 5D and 5E (and subsequent similarly-lettered B, D and E figures) may be used for different ones of the gate structures 203-1, 203-2 and 203-3, or even along different portions of the length (in direction Y-Y') of a particular one of the gate structures 203-1, 203-2 and 203-3, in any desired combination.

The material of the HM layer 230 may be blanket deposited over the structure, followed by lithographic processing to result in the patterned HM layer 230 shown in FIGS. 5A-5E. The material of the HM layer 230 may include SiN, a multi-layer of SiN and SiO$_2$, or another suitable material. The HM layer 230 may have a height (in direction Z-Z') in the range of 20 to 100 nm.

Once the HM layer 230 is patterned, nanosheet cuts are performed as shown in FIGS. 5B-5E. FIGS. 5B and 5C show an opening 501-1 formed by the nanosheet cut of the nanosheet channel layers 208-2 for case (i), which stops on the MDI layer 216-2. FIG. 5D shows an opening 501-2 formed by the alternative nanosheet cut of the nanosheet channel layers 208-2 for case (ii), which also stops on the MDI layer 216-2. FIG. 5E shows an opening 501-3 formed by the other alternative nanosheet cut of the nanosheet channel layers 208-2 for case (iii), which also stops on the MDI layer 216-2. The widths (in direction Y-Y') of the openings 501-1, 501-2 and 501-3 may be in the range of 10 to 40 nm. Here, the width (in direction Y-Y') of the opening 501-1 is less than the width (in direction Y-Y') of the opening 501-3, which is less than the width (in direction Y-Y') of the opening 501-2.

Figure 6E:
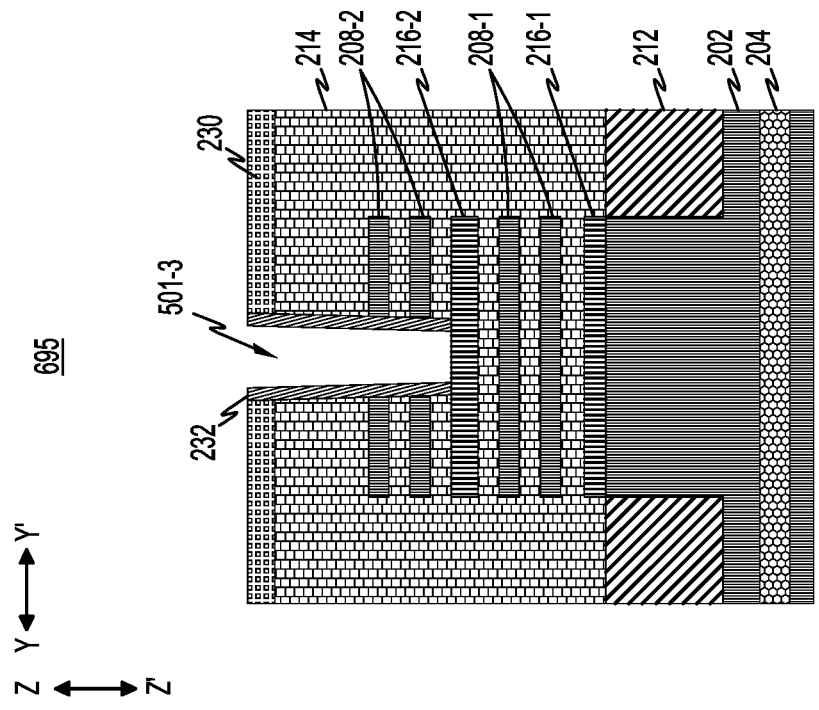
FIG. 6E depicts a fourth side cross-sectional view of the structure of FIGS. 5A-5E following the formation of the protection spacer for the first set of the nanosheets, according to an embodiment of the invention.
Figure 6D:
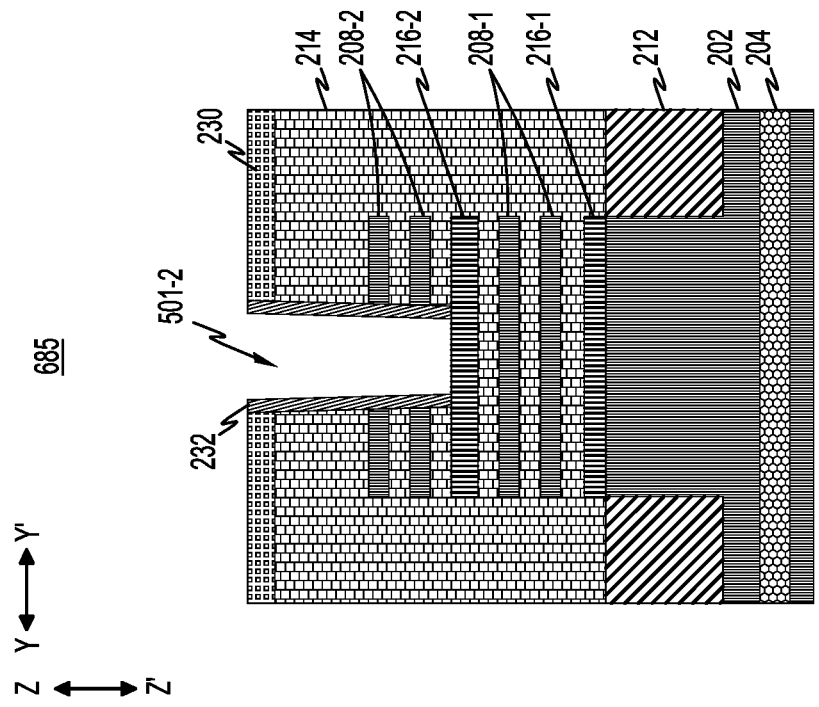
FIG. 6D depicts a third side cross-sectional view of the structure of FIGS. 5A-5E following the formation of the protection spacer for the first set of the nanosheets, according to an embodiment of the invention.

FIG. 6A shows a first side cross-sectional view 600 of the structure of FIGS. 5A-5E following formation of a protection spacer layer 232. FIG. 6B shows a second side cross-sectional view 665 of the structure of FIGS. 5A-5E following the formation of the protection spacer layer 232. FIG. 6C shows a top-down view 675 of the structure of FIGS. 5A-5E following the formation of the protection spacer layer 232. FIG. 6D shows a third side cross-sectional view 685 of the structure of FIGS. 5A-5E following the formation of the protection spacer layer 232. FIG. 6E shows a fourth side cross-sectional view 695 of the structure of FIGS. 5A-5E following the formation of the protection spacer layer 232. The first side cross-sectional view 600 of FIG. 6A is taken along the line A-A in the top-down view 675, while the second, third and fourth side cross-sectional views 665, 685 and 695 of FIGS. 6B, 6D and 6E are taken along the line B/D/E-B/D/E in the top-down view 675.

The protection spacer layer 232 may be formed using a conformal deposition process, followed by a directional etch to remove portions of the material of the protection spacer layer on the top of the HM layer 230 and MDI layer 216-2. The protection spacer layer 232 may be formed of a material such as SiC, SiO$_2$, TiO$_x$, aluminum nitride (AlN), etc. that can be etched selective to the material of the MDI layer 216-2. The protection spacer layer 232 may have a thickness in the range of 1 to 5 nm. The protection spacer layer 232 protects the nanosheet channel layers 208-2 during subsequent processing.

Figure 7C:
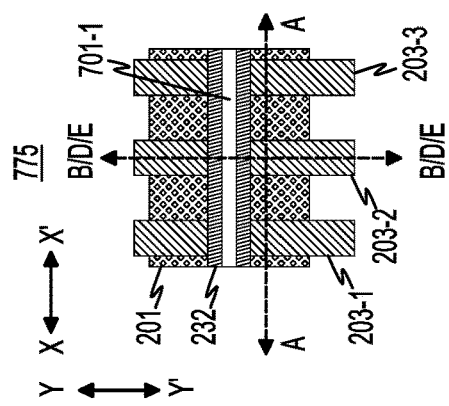
FIG. 7C depicts a top-down view of the structure of FIGS. 6A-6E following the etching of the middle dielectric isolation layer and the second set of the nanosheets, according to an embodiment of the invention.
Figure 7B:
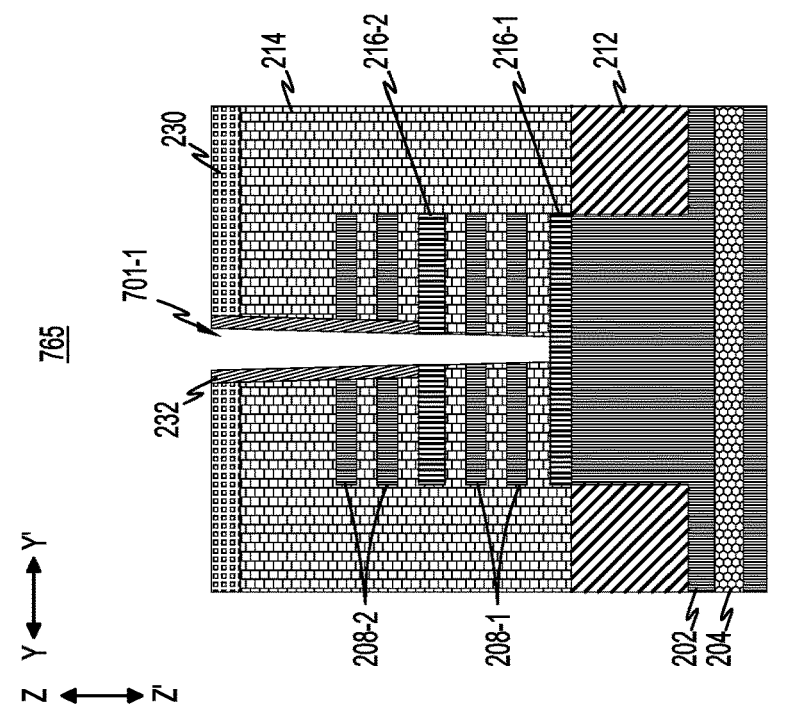
FIG. 7B depicts a second side cross-sectional view of the structure of FIGS. 6A-6E following the etching of the middle dielectric isolation layer and the second set of the nanosheets, according to an embodiment of the invention.
Figure 7A:
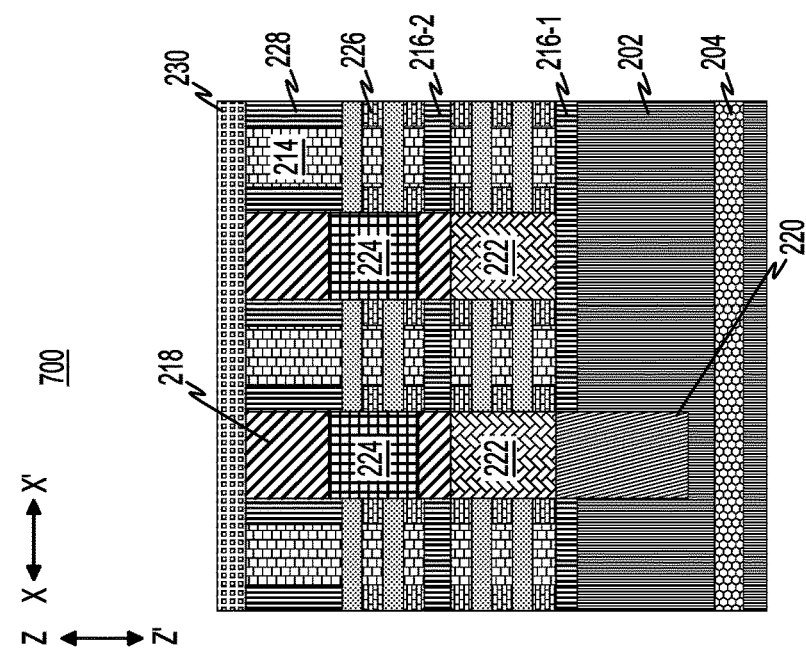
FIG. 7A depicts a first side cross-sectional view of the structure of FIGS. 6A-6E following etching of a middle dielectric isolation layer and a second set of the nanosheets, according to an embodiment of the invention.
Figure 7E:
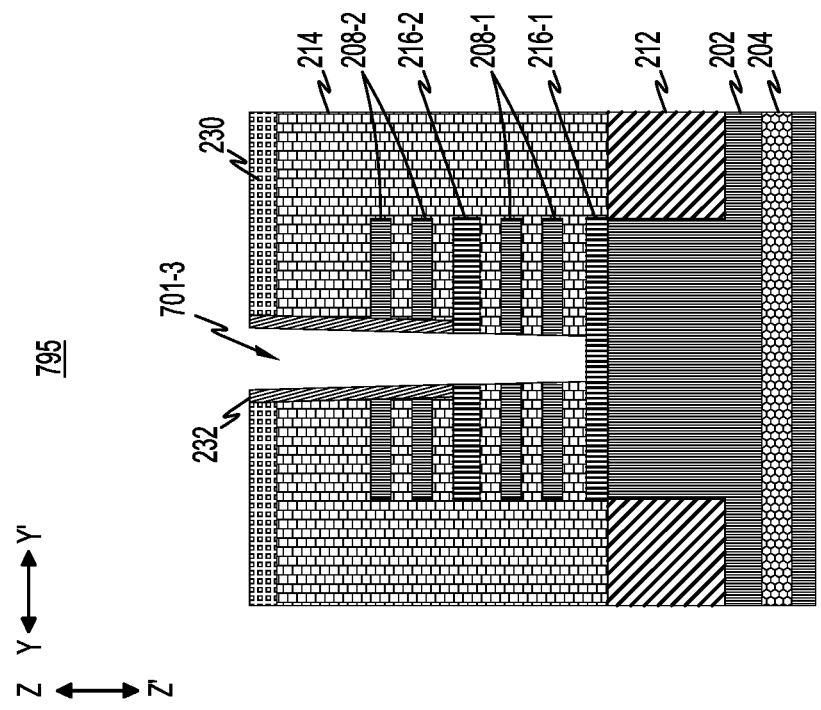
FIG. 7E depicts a fourth side cross-sectional view of the structure of FIGS. 6A-6E following the etching of the middle dielectric isolation layer and the second set of the nanosheets, according to an embodiment of the invention.
Figure 7D:
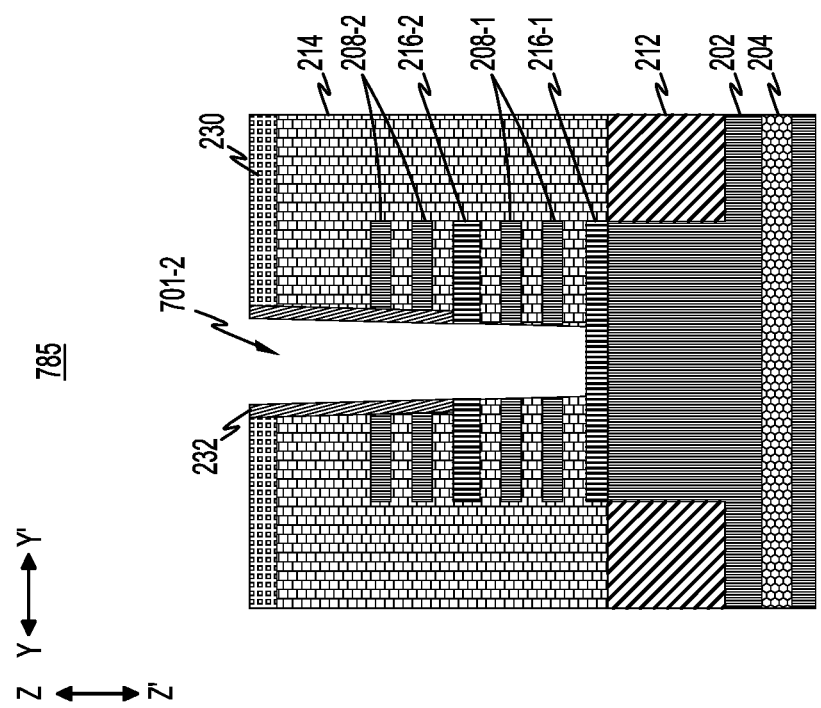
FIG. 7D depicts a third side cross-sectional view of the structure of FIGS. 6A-6E following the etching of the middle dielectric isolation layer and the second set of the nanosheets, according to an embodiment of the invention.

FIG. 7A shows a first side cross-sectional view 700 of the structure of FIGS. 6A-6E following etching of the MDI layer 216-2 and the nanosheet channel layers 208-1. FIG. 7B shows a second side cross-sectional view 765 of the structure of FIGS. 6A-6E following the etching of the MDI layer 216-2 and the nanosheet channel layers 208-1. FIG. 7C shows a top-down view 775 of the structure of FIGS. 6A-6E following the etching of the MDI layer 216-2 and the nanosheet channel layers 208-1. FIG. 7D shows a third side cross-sectional view 785 of the structure of FIGS. 6A-6E following the etching of the MDI layer 216-2 and the nanosheet channel layers 208-1. FIG. 7E shows a fourth side cross-sectional view 795 of the structure of FIGS. 6A-6E following the etching of the MDI layer 216-2 and the nanosheet channel layers 208-1. The first side cross-sectional view 700 of FIG. 7A is taken along the line A-A in the top-down view 775, while the second, third and fourth side cross-sectional views 765, 785 and 795 of FIGS. 7B, 7D and 7E are taken along the line B/D/E-B/D/E in the top-down view 775.

A first etch process (e.g., RIE, a wet etch process, etc.) is used to remove the exposed portion of the MDI layer 216-2, and a second etch process (e.g., RIE, a wet etch process, etc.) is then used to remove the exposed portions of the nanosheet channel layers 208-1, stopping on the BDI layer 216-1. This results in openings 701-1, 701-2 and 701-3 as shown in FIGS. 7B, 7D and 7E. The widths (in direction Y-Y') of the openings 701-1, 701-2 and 701-3 may be in the range of 8 to 38 nm. Here, the width (in direction Y-Y') of the opening 701-1 is less than the width (in direction Y-Y') of the opening 701-3, which is less than the width (in direction Y-Y') of the opening 701-2.

Figure 8C:
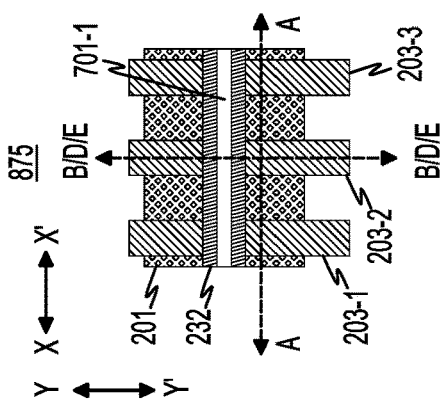
FIG. 8C depicts a top-down view of the structure of FIGS. 7A-7E following the indentation of the second set of the nanosheets, according to an embodiment of the invention.
Figure 8B:
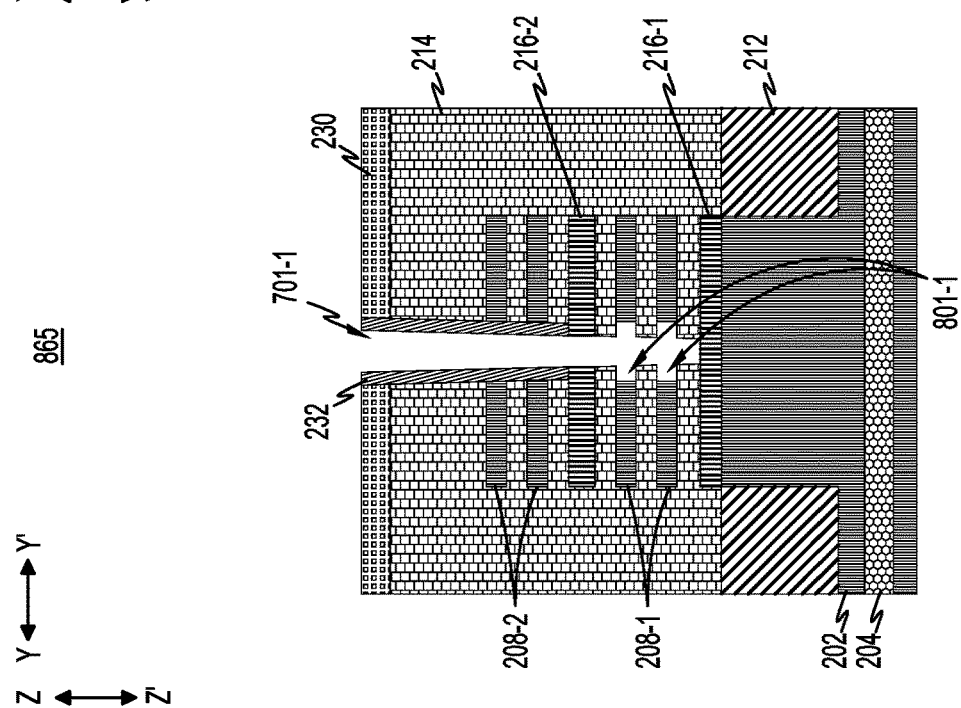
FIG. 8B depicts a second side cross-sectional view of the structure of FIGS. 7A-7E following the indentation of the second set of the nanosheets, according to an embodiment of the invention.
Figure 8A:
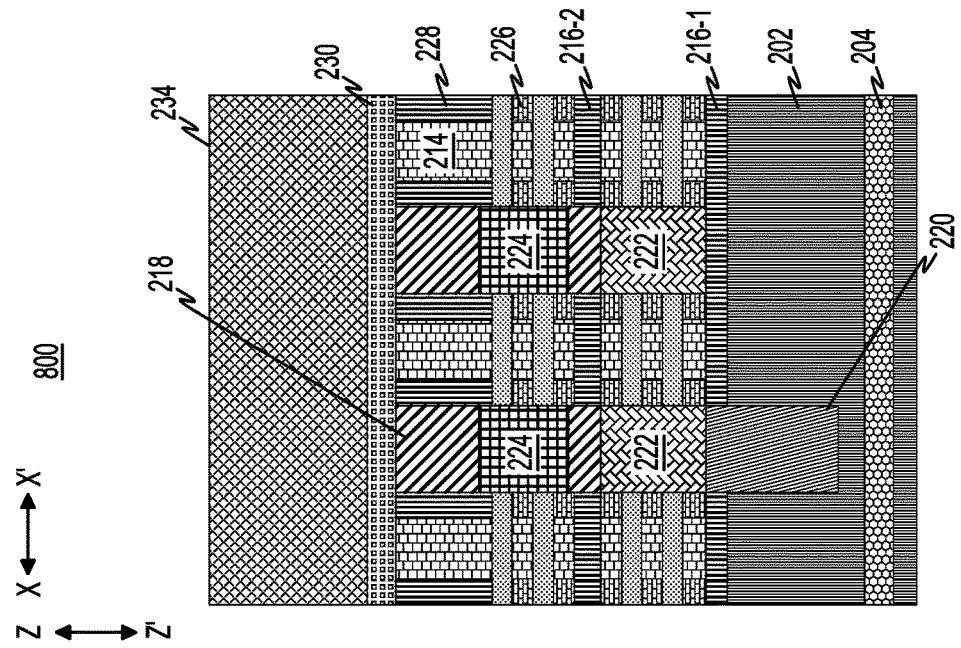
FIG. 8A depicts a first side cross-sectional view of the structure of FIGS. 7A-7E following indentation of the second set of the nanosheets, according to an embodiment of the invention.
Figure 8E:
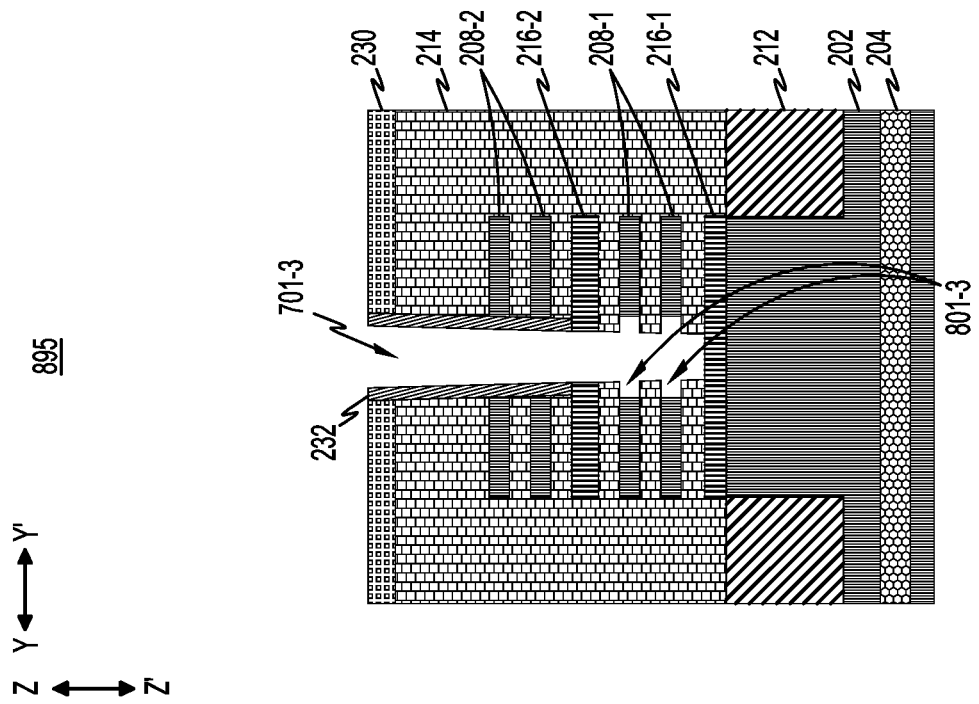
FIG. 8E depicts a fourth side cross-sectional view of the structure of FIGS. 7A-7E following the indentation of the second set of the nanosheets, according to an embodiment of the invention.
Figure 8D:
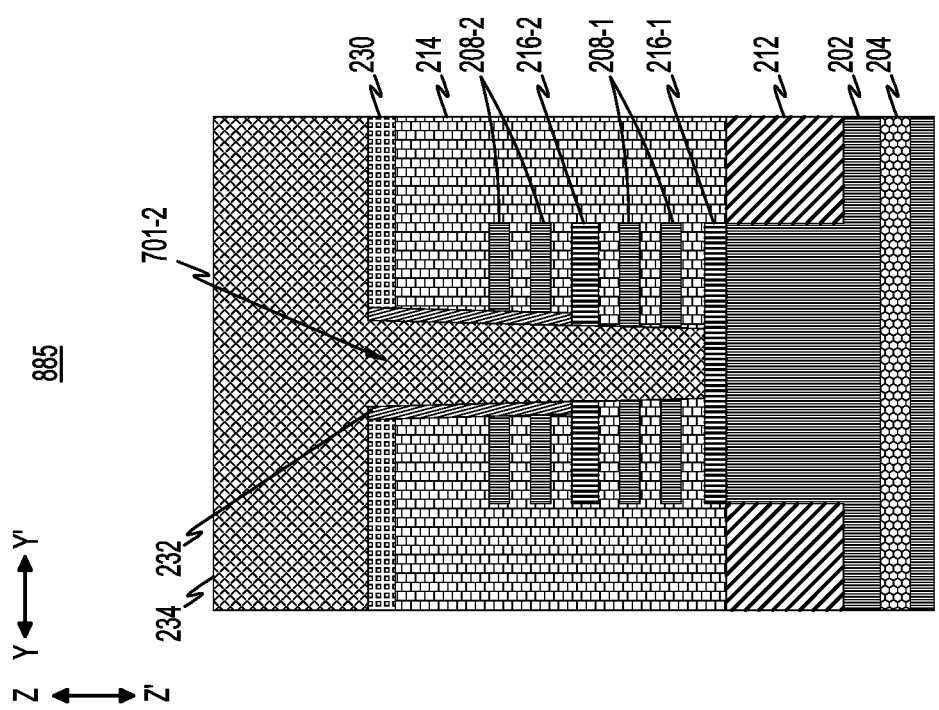
FIG. 8D depicts a third side cross-sectional view of the structure of FIGS. 7A-7E following patterning of a protection layer over the second set of the nanosheets, according to an embodiment of the invention.

FIG. 8A shows a first side cross-sectional view 800 of the structure of FIGS. 7A-7E following indentations of the nanosheet channel layers 208-1 which are not covered by a mask layer (e.g., an OPL layer 234) patterned using lithography and etch processing. FIG. 8B shows a second side cross-sectional view 865 of the structure of FIGS. 7A-7E following the indentations of the nanosheet channel layers 208-1 which are not covered by the OPL layer 234. FIG. 8C shows a top-down view 875 of the structure of FIGS. 7A-7E following the indentations of the nanosheet channel layers 208-1 which are not covered by the OPL layer 234. FIG. 8D shows a third side cross-sectional view 885 of the structure of FIGS. 7A-7E following the indentations of the nanosheet channel layers 208-1 which are not covered by the OPL layer 234. FIG. 8E shows a fourth side cross-sectional view 895 of the structure of FIGS. 7A-7E following the indentations of the nanosheet channel layers 208-1 which are not covered by the OPL layer 234. The first side cross-sectional view 800 of FIG. 8A is taken along the line A-A in the top-down view 875, while the second, third and fourth side cross-sectional views 865, 885 and 895 of FIGS. 8B, 8D and 8E are taken along the line B/D/E-B/D/E in the top-down view 875.

The OPL layer 234, as shown in FIG. 8D, covers the nanosheet channel layers 208-1 in the opening 701-2. The openings 701-1 and 701-3 are left exposed by the OPL layer 234, and an indent etch is performed to form indents 801-1 and 801-3 in the nanosheet channel layers 208-1 as shown in FIGS. 8B and 8E, respectively.

Figures 9A, 9B, 9C:
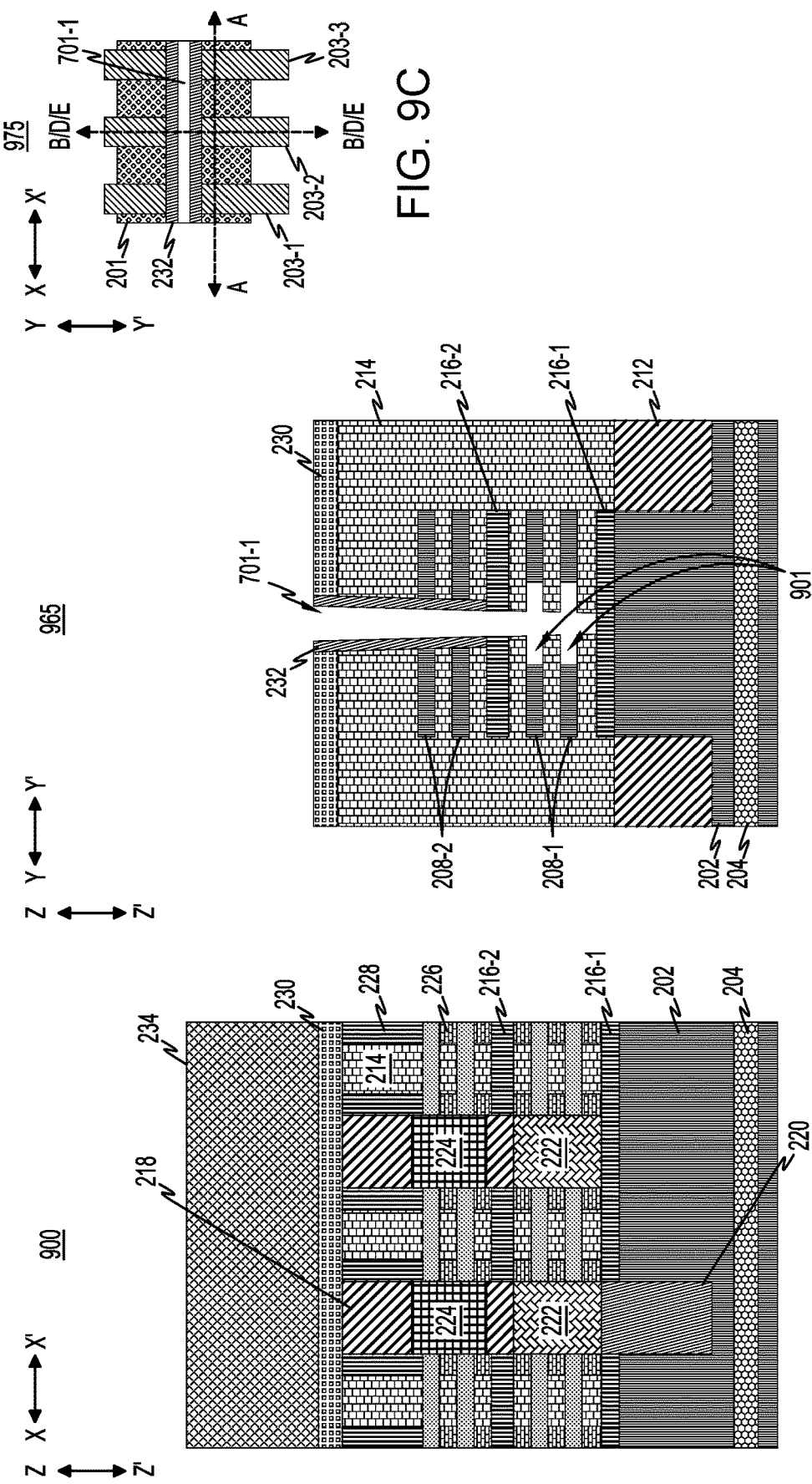
FIG. 9A depicts a first side cross-sectional view of the structure of FIGS. 8A-8E following further indentation of the second set of the nanosheets, according to an embodiment of the invention.
FIG. 9B depicts a second side cross-sectional view of the structure of FIGS. 8A-8E following the further indentation of the second set of the nanosheets, according to an embodiment of the invention.
FIG. 9C depicts a top-down view of the structure of FIGS. 8A-8E following the further indentation of the second set of the nanosheets, according to an embodiment of the invention.
Figure 9E:
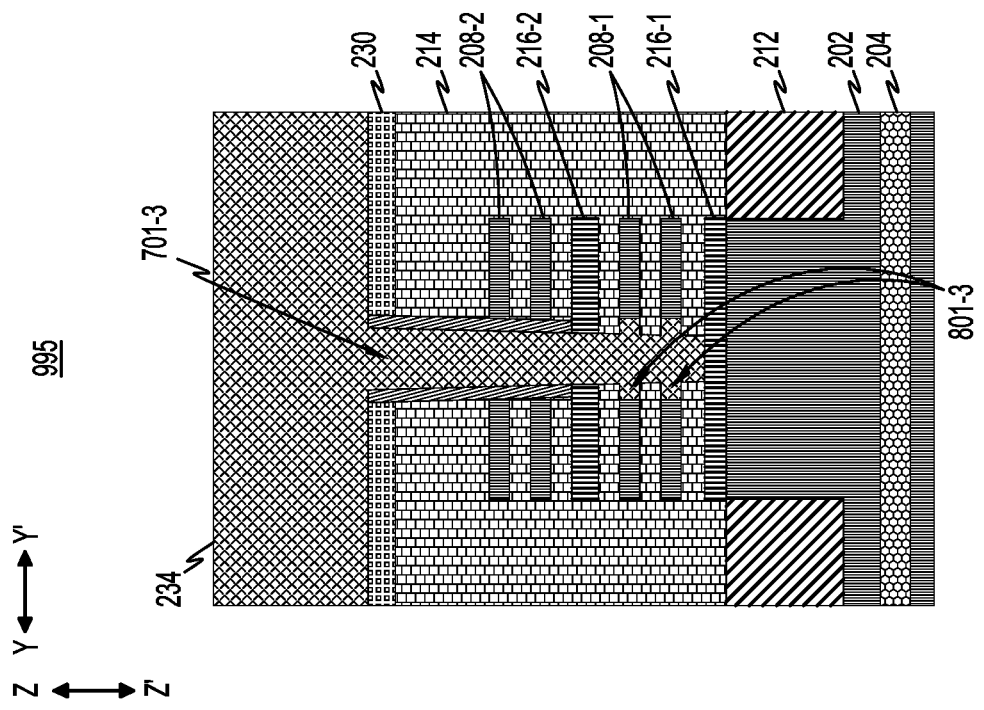
FIG. 9E depicts a fourth side cross-sectional view of the structure of FIGS. 8A-8E following the patterning of the protection layer over the second set of the nanosheets, according to an embodiment of the invention.
Figure 9D:
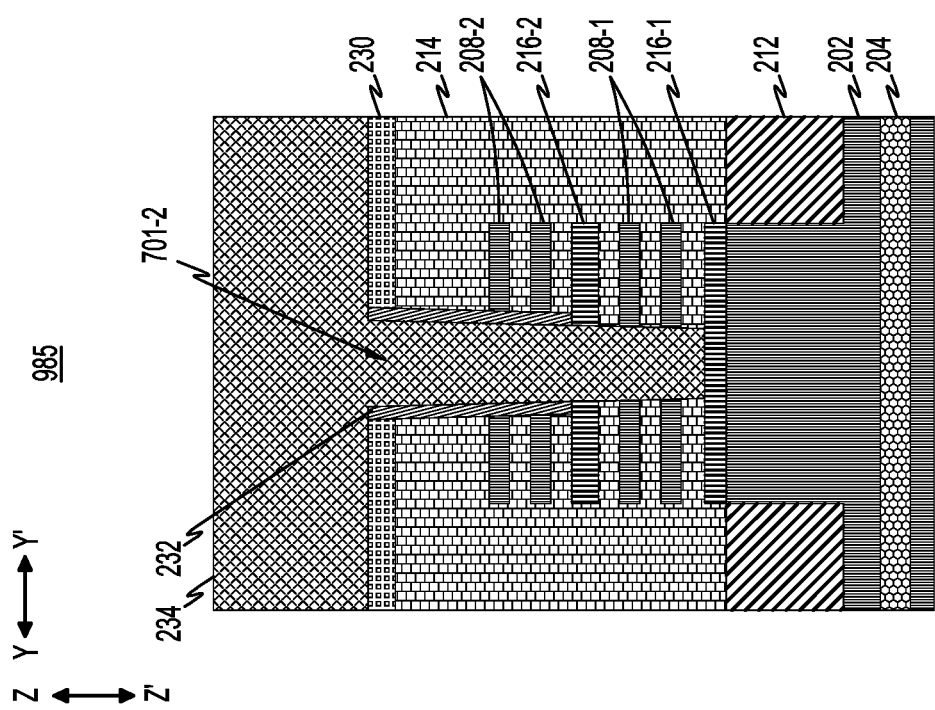
FIG. 9D depicts a third side cross-sectional view of the structure of FIGS. 8A-8E following patterning of the protection layer over the second set of the nanosheets, according to an embodiment of the invention.

FIG. 9A shows a first side cross-sectional view 900 of the structure of FIGS. 8A-8E following further indentations of the nanosheet channel layers 208-1 which are not covered by a mask layer (e.g., the OPL layer 234) patterned using lithography and etch processing. FIG. 9B shows a second side cross-sectional view 965 of the structure of FIGS. 8A-8E following the further indentations of the nanosheet channel layers 208-1 which are not covered by the OPL layer 234. FIG. 9C shows a top-down view 975 of the structure of FIGS. 8A-8E following the further indentations of the nanosheet channel layers 208-1 which are not covered by the OPL layer 234. FIG. 9D shows a third side cross-sectional view 985 of the structure of FIGS. 8A-8E following the further indentations of the nanosheet channel layers 208-1 which are not covered by the OPL layer 234. FIG. 9E shows a fourth side cross-sectional view 995 of the structure of FIGS. 8A-8E following the further indentations of the nanosheet channel layers 208-1 which are not covered by the OPL layer 234. The first side cross-sectional view 900 of FIG. 9A is taken along the line A-A in the top-down view 975, while the second, third and fourth side cross-sectional views 965, 985 and 995 of FIGS. 9B, 9D and 9E are taken along the line B/D/E-B/D/E in the top-down view 975.

The OPL layer 234, as shown in FIGS. 9D and 9E, is now formed to cover the nanosheet channel layers 208-1 in the openings 701-2 and 701-3. The opening 701-1 is left exposed by the OPL layer 234, and an additional indent etch is performed to form additional indents 901 in the nanosheet channel layers 208-1 as shown in FIG. 9B. Thus, the indents 901 have a width (in direction X-X') that exceeds the width (in direction X-X') of the indents 801-3.

Figure 10C:
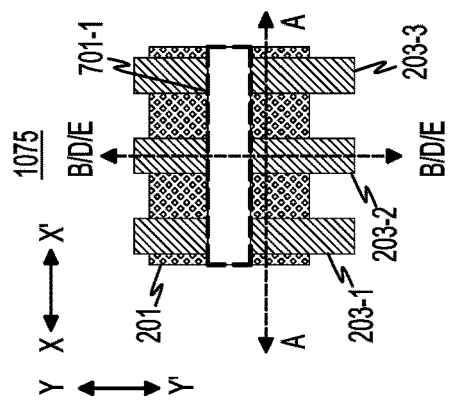
FIG. 10C depicts a top-down view of the structure of FIGS. 9A-9E following the removal of the protection layer and the protection spacer, according to an embodiment of the invention.
Figure 10B:
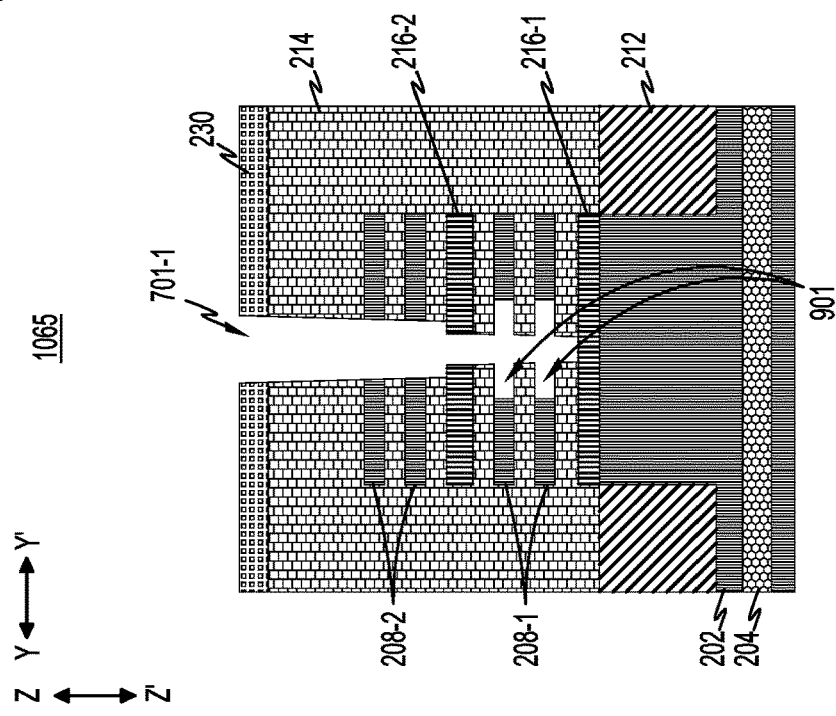
FIG. 10B depicts a second side cross-sectional view of the structure of FIGS. 9A-9E following the removal of the protection layer and the protection spacer, according to an embodiment of the invention.
Figure 10A:
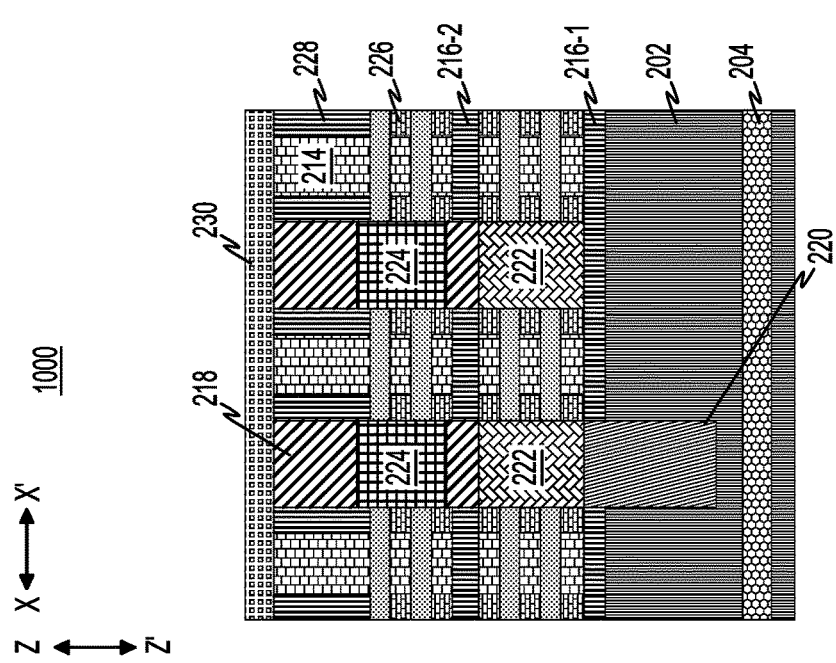
FIG. 10A depicts a first side cross-sectional view of the structure of FIGS. 9A-9E following removal of the protection layer and the protection spacer, according to an embodiment of the invention.
Figure 10E:
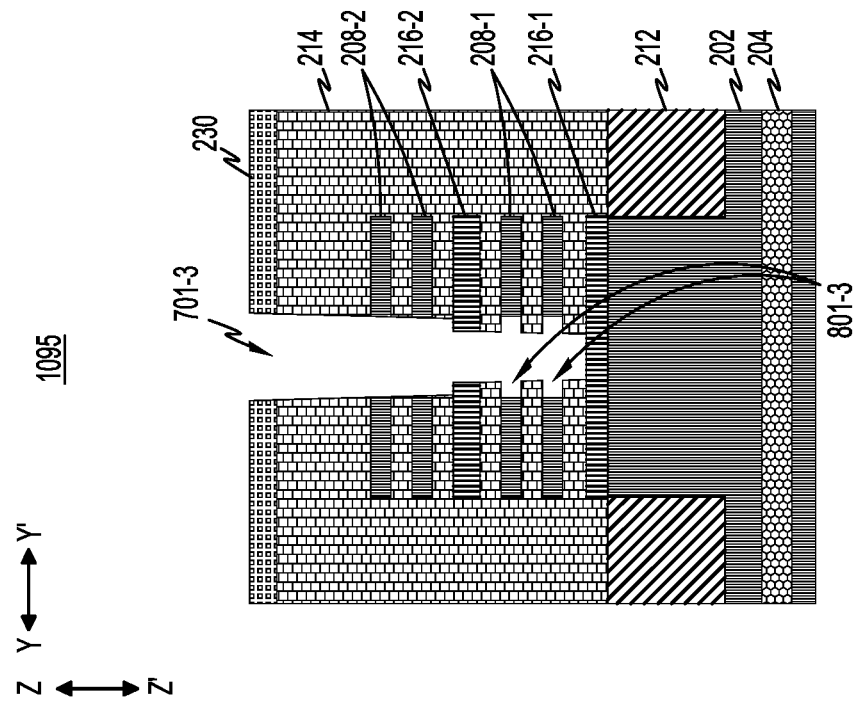
FIG. 10E depicts a fourth side cross-sectional view of the structure of FIGS. 9A-9E following the removal of the protection layer and the protection spacer, according to an embodiment of the invention.
Figure 10D:
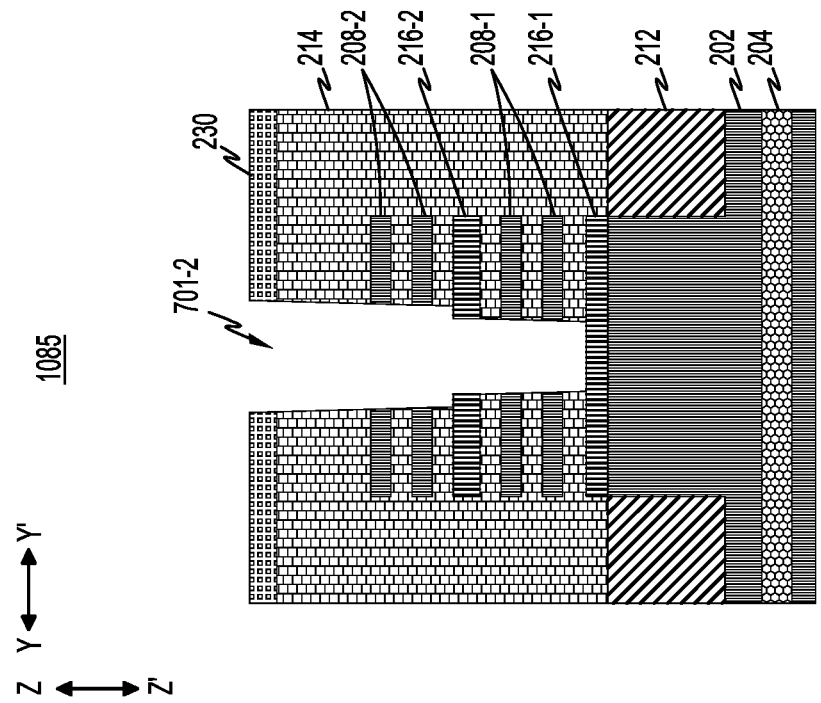
FIG. 10D depicts a third side cross-sectional view of the structure of FIGS. 9A-9E following the removal of the protection layer and the protection spacer, according to an embodiment of the invention.

FIG. 10A shows a first side cross-sectional view 1000 of the structure of FIGS. 9A-9E following removal of the OPL layer 234 and the protection spacer layer 232. FIG. 10B shows a second side cross-sectional view 1065 of the structure of FIGS. 9A-9E following the removal of the OPL layer 234 and the protection spacer layer 232. FIG. 10C shows a top-down view 1075 of the structure of FIGS. 9A-9E following the removal of the OPL layer 234 and the protection spacer layer 232. FIG. 10D shows a third side cross-sectional view 1085 of the structure of FIGS. 9A-9E following the removal of the OPL layer 234 and the protection spacer layer 232. FIG. 10E shows a fourth side cross-sectional view 1095 of the structure of FIGS. 9A-9E following the removal of the OPL layer 234 and the protection spacer layer 232. The first side cross-sectional view 1000 of FIG. 10A is taken along the line A-A in the top-down view 1075, while the second, third and fourth side cross-sectional views 1065, 1085 and 1095 of FIGS. 10B, 10D and 10E are taken along the line B/D/E-B/D/E in the top-down view 1075.

The OPL layer 234 and protection spacer layer 232 may be removed using any suitable etch processing which removes the materials of the OPL layer 234 and the protection spacer layer 232 selective to the materials of the remaining structure.

Figure 11C:
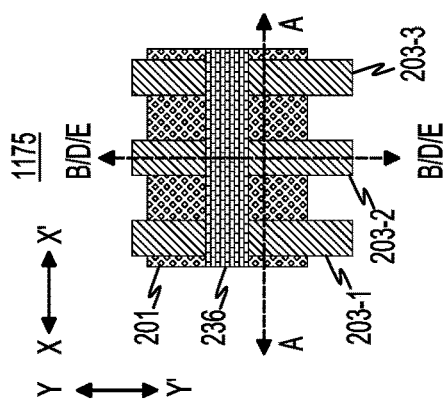
FIG. 11C depicts a top-down view of the structure of FIGS. 10A-10E following the formation of the dielectric pillar, according to an embodiment of the invention.
Figure 11B:
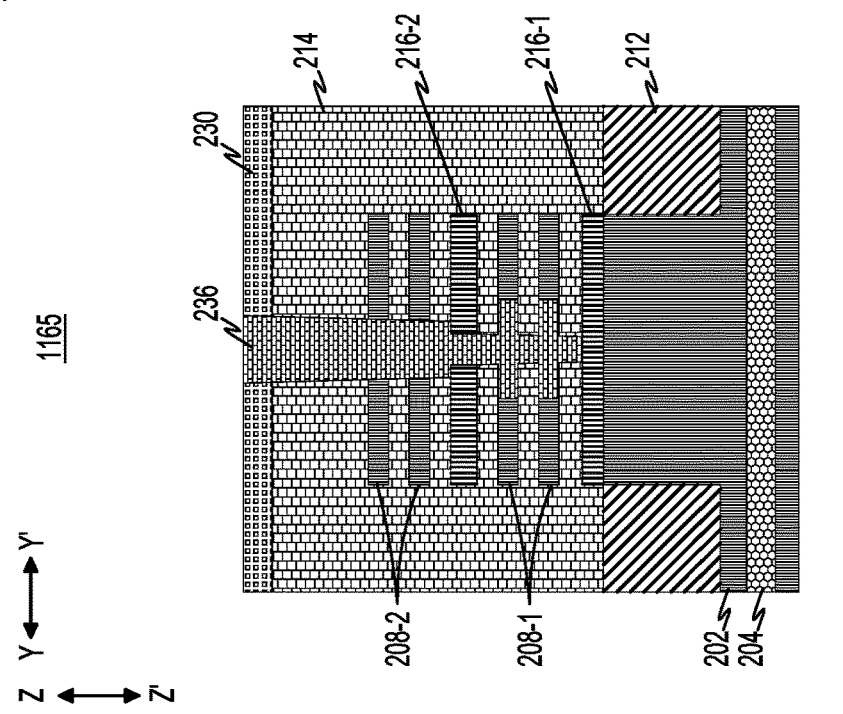
FIG. 11B depicts a second side cross-sectional view of the structure of FIGS. 10A-10E following the formation of the dielectric pillar, according to an embodiment of the invention.
Figure 11A:
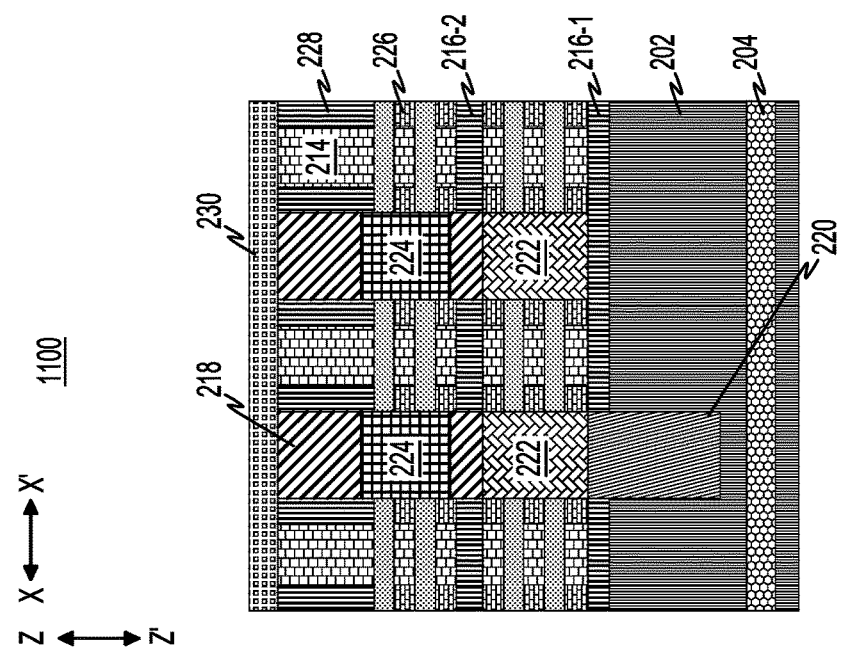
FIG. 11A depicts a first side cross-sectional view of the structure of FIGS. 10A-10E following formation of a dielectric pillar, according to an embodiment of the invention.
Figure 11E:
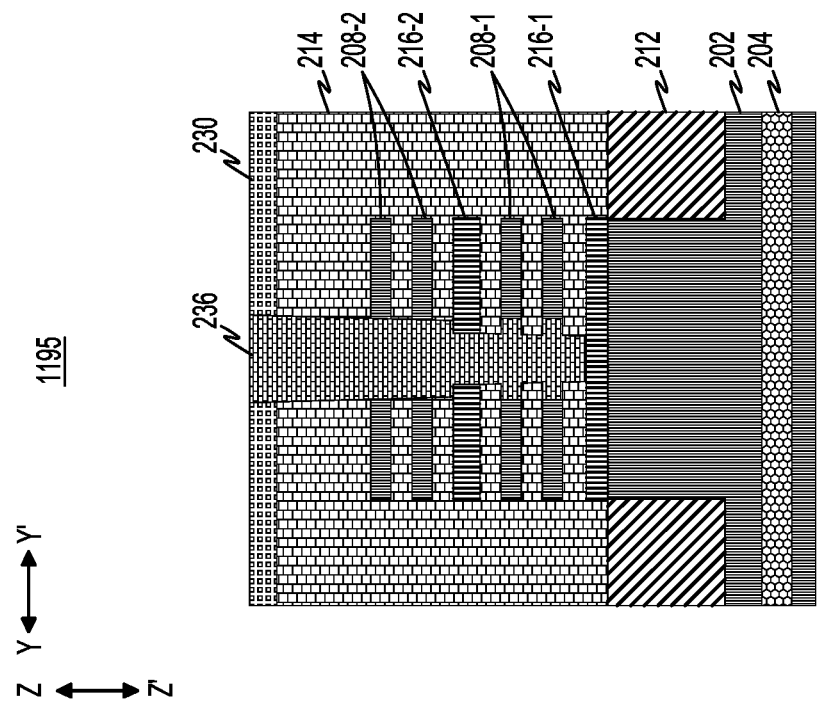
FIG. 11E depicts a fourth side cross-sectional view of the structure of FIGS. 10A-10E following the formation of the dielectric pillar, according to an embodiment of the invention.
Figure 11D:
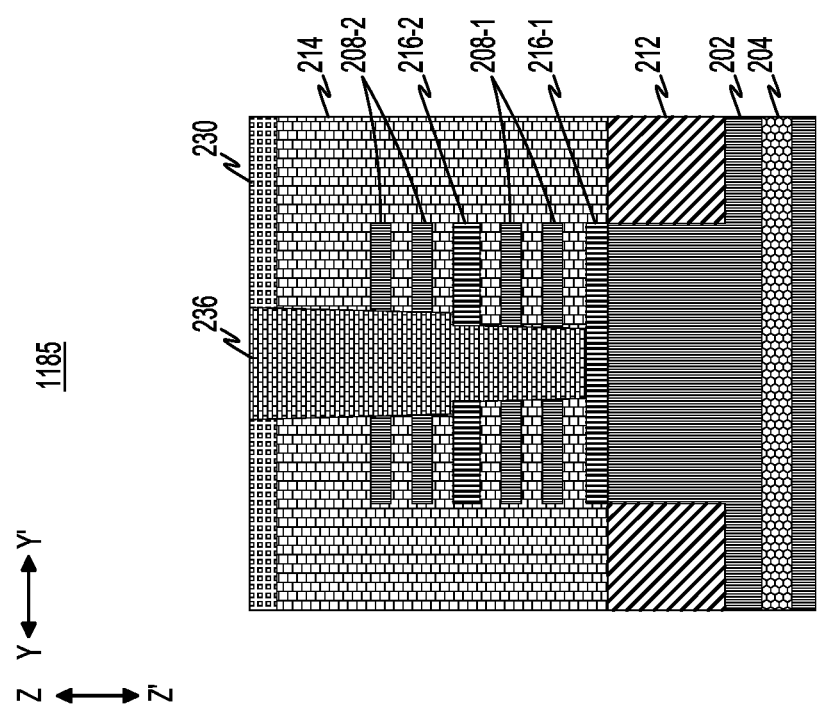
FIG. 11D depicts a third side cross-sectional view of the structure of FIGS. 10A-10E following the formation of the dielectric pillar, according to an embodiment of the invention.

FIG. 11A shows a first side cross-sectional view 1100 of the structure of FIGS. 10A-10E following formation of a dielectric pillar layer 236 in the openings 701-1, 701-2 and 701-3 and indents 801-3 and 901. FIG. 11B shows a second side cross-sectional view 1165 of the structure of FIGS. 10A-10E following the formation of the dielectric pillar layer 236 in the openings 701-1, 701-2 and 701-3 and the indents 801-3 and 901. FIG. 11C shows a top-down view 1175 of the structure of FIGS. 10A-10E following the formation of the dielectric pillar layer 236 in the openings 701-1, 701-2 and 701-3 and the indents 801-3 and 901. FIG. 11D shows a third side cross-sectional view 1185 of the structure of FIGS. 10A-10E following the formation of the dielectric pillar layer 236 in the openings 701-1, 701-2 and 701-3 and the indents 801-3 and 901. FIG. 11E shows a fourth side cross-sectional view 1195 of the structure of FIGS. 10A-10E following the formation of the dielectric pillar layer 236 in the openings 701-1, 701-2 and 701-3 and the indents 801-3 and 901. The first side cross-sectional view 1100 of FIG. 11A is taken along the line A-A in the top-down view 1175, while the second, third and fourth side cross-sectional views 1165, 1185 and 1195 of FIGS. 11B, 11D and 11E are taken along the line B/D/E-B/D/E in the top-down view 1175.

The dielectric pillar layer 236 may be filling a dielectric material such as SiN, $SiO_2$, SiOC, SiOCN, SiBCN, SiC, etc., followed by planarization using CMP or other suitable processing stopping on the top surface of the HM layer 230. As shown in FIGS. 11B and 11E, the dielectric pillar layer 236 has a fork-like shape filling the indents 801-3 and 901.

Figure 12E:
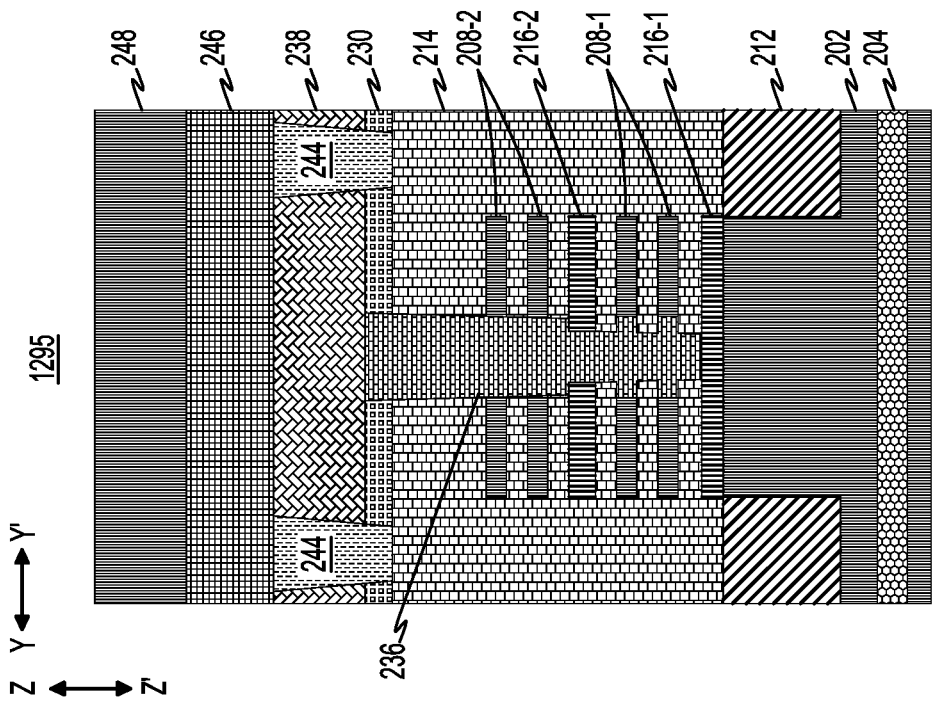
FIG. 12E depicts a fourth side cross-sectional view of the structure of FIGS. 11A-11E following the formation of the middle-of-line contacts and the back-end-of-line interconnects and following the bonding of the structure to the carrier wafer, according to an embodiment of the invention.
Figure 12D:
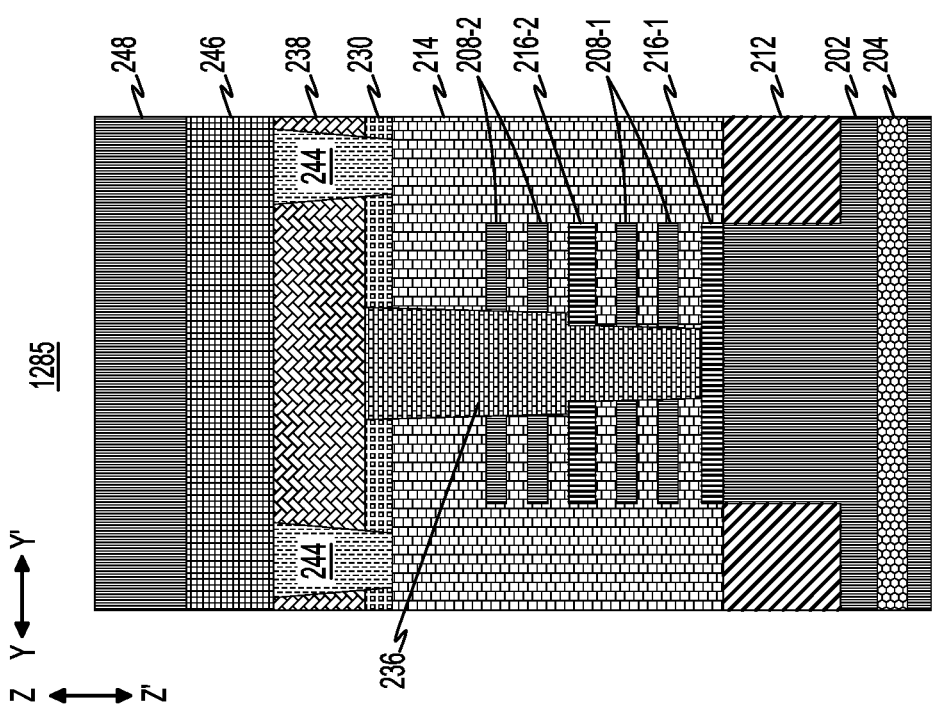
FIG. 12D depicts a third side cross-sectional view of the structure of FIGS. 11A-11E following the formation of the middle-of-line contacts and the back-end-of-line interconnects and following the bonding of the structure to the carrier wafer, according to an embodiment of the invention.

FIG. 12A shows a first side cross-sectional view 1200 of the structure of FIGS. 11A-11E following formation of middle-of-line (MOL) contacts, front side BEOL interconnects, and carrier wafer bonding. FIG. 12B shows a second side cross-sectional view 1265 of the structure of FIGS. 11A-11E following the formation of the MOL contacts, the front side BEOL interconnects, and the carrier wafer bonding. FIG. 12C shows a top-down view 1275 of the structure of FIGS. 11A-11E following the formation of the MOL contacts, the front side BEOL interconnects, and the carrier wafer bonding. FIG. 12D shows a third side cross-sectional view 1285 of the structure of FIGS. 11A-11E following the formation of the MOL contacts, the front side BEOL interconnects, and the carrier wafer bonding. FIG. 12E shows a fourth side cross-sectional view 1295 of the structure of FIGS. 11A-11E following the formation of the MOL contacts, the front side BEOL interconnects, and the carrier wafer bonding. The first side cross-sectional view 1200 of FIG. 12A is taken along the line A-A in the top-down view 1275, while the second, third and fourth side cross-sectional views 1265, 1285 and 1295 of FIGS. 12B, 12D and 12E are taken along the line B/D/E-B/D/E in the top-down view 1275.

Formation of the MOL contacts, the front side BEOL interconnects and the carrier wafer bonding includes formation of an ILD layer 238, bottom source/drain contact 240, top source/drain contact 242, gate contacts 244, front side BEOL interconnects 246 and bonding of the structure (e.g., the front side BEOL interconnects 246) to a carrier wafer 248.

The ILD layer 238 may be formed of materials similar to that of the ILD layer 218. The ILD layer 238 may have a height (in direction Z-Z') in the range of 20 to 100 nm.

The bottom source/drain contact 240, the top source/drain contact 242, and the gate contacts 244 may include a silicide layer such as titanium (Ti), nickel (Ni), nickel platinum (NiPt), etc., and a metal adhesion layer (e.g., such as TiN) and a low resistance metal such as ruthenium (Ru), tungsten (W), cobalt (Co) or another suitable material. Each of the bottom source/drain contact 240, the top source/drain contact 242 and the gate contacts 244 may have a width (in direction X-X' or Y-Y') in the range of 8 to 50 nm, and a height (in direction Z-Z') that extends from the bottom surface of the front side BEOL interconnects 246 to the portion of the structure it contacts (e.g., the bottom source/drain regions 222 for the bottom source/drain contact 240, the top source/drain regions 224 for the top source/drain contact 242, and the gate stack layer 214 for the gate contacts 244).

The front side BEOL interconnects 246 include various BEOL interconnect structures. The carrier wafer 248 may be formed of materials similar to that of the substrate 202, and may be formed over the front side BEOL interconnects 246 using a wafer bonding process, such as dielectric-to-dielectric bonding.

Figures 13A, 13B, 13C:
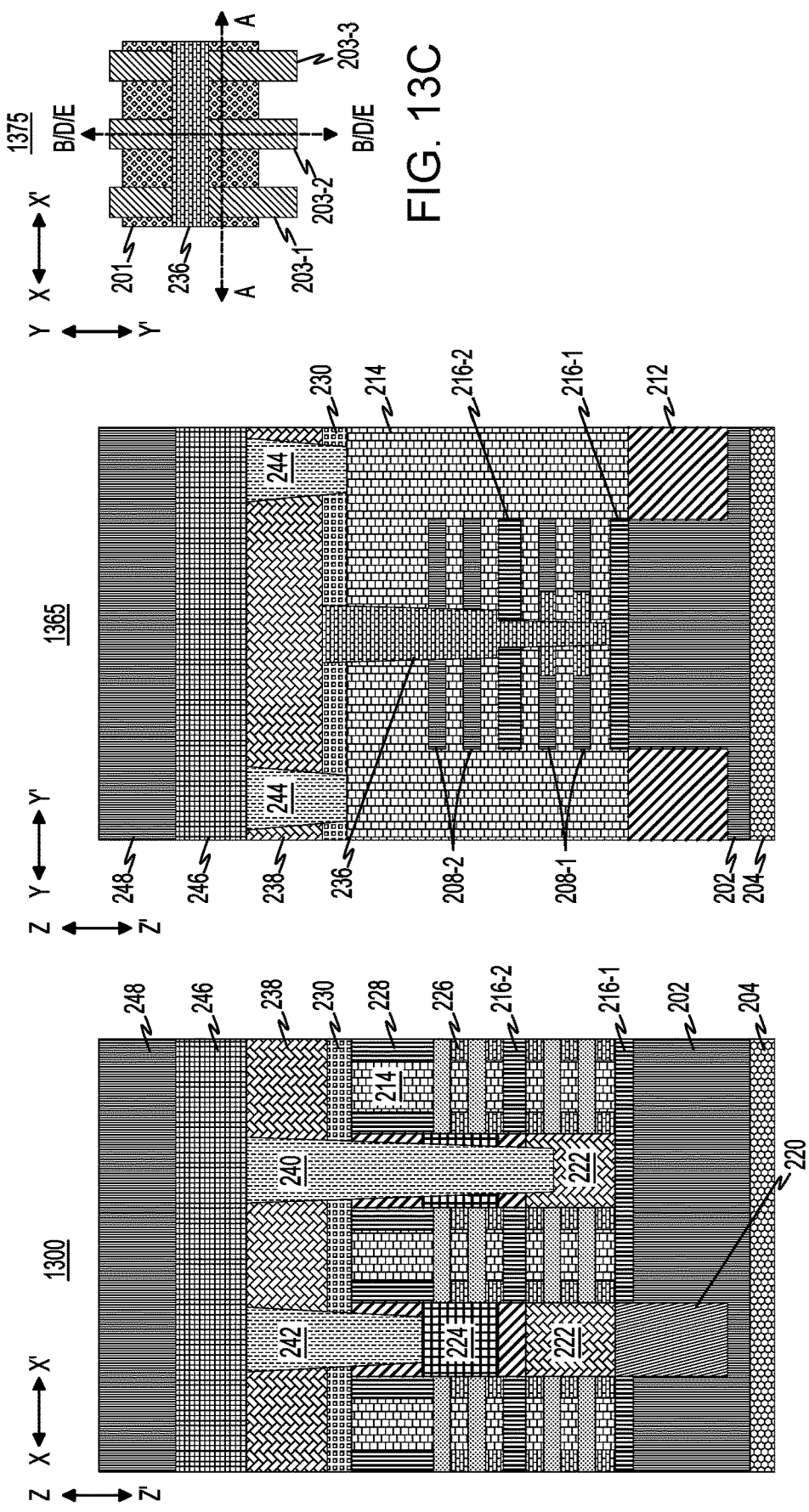
FIG. 13A depicts a first side cross-sectional view of the structure of FIGS. 12A-12E following removal of the substrate from the back side of the structure stopping on an etch stop layer, according to an embodiment of the invention.
FIG. 13B depicts a second side cross-sectional view of the structure of FIGS. 12A-12E following the removal of the substrate from the back side of the structure stopping on the etch stop layer, according to an embodiment of the invention.
FIG. 13C depicts a top-down view of the structure of FIGS. 12A-12E following the removal of the substrate from the back side of the structure stopping on the etch stop layer, according to an embodiment of the invention.
Figure 13E:
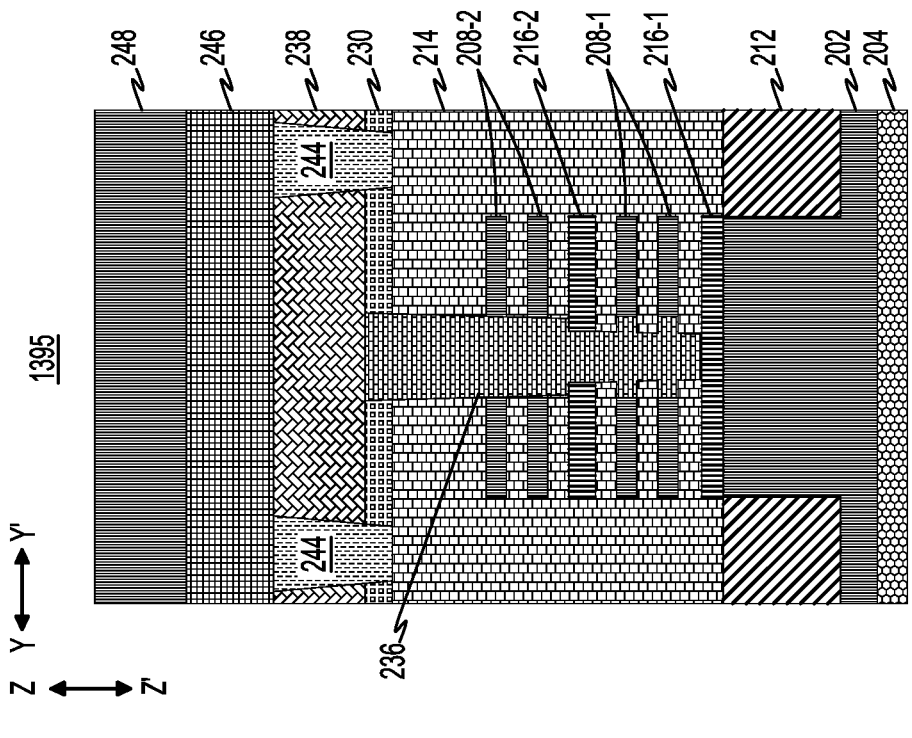
FIG. 13E depicts a fourth side cross-sectional view of the structure of FIGS. 12A-12E following the removal of the substrate from the back side of the structure stopping on the etch stop layer, according to an embodiment of the invention.
Figure 13D:
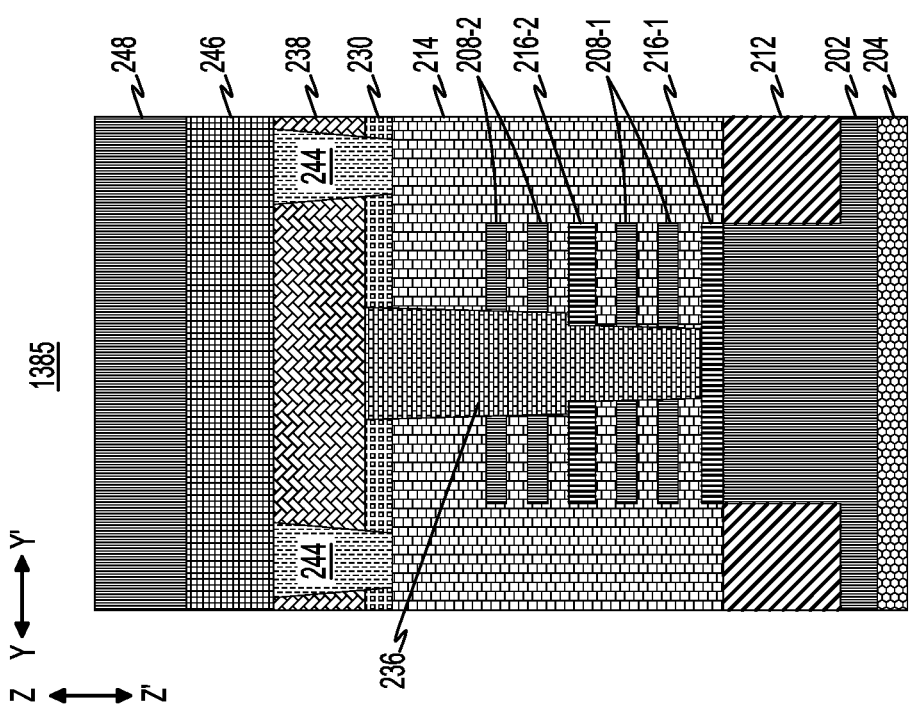
FIG. 13D depicts a third side cross-sectional view of the structure of FIGS. 12A-12E following the removal of the substrate from the back side of the structure stopping on the etch stop layer, according to an embodiment of the invention.

FIG. 13A shows a first side cross-sectional view 1300 of the structure of FIGS. 12A-12E following removal of portions of the substrate 202 stopping on the etch stop layer 204. FIG. 13B shows a second side cross-sectional view 1365 of the structure of FIGS. 12A-12E following the removal of portions of the substrate 202 stopping on the etch stop layer 204. FIG. 13C shows a top-down view 1375 of the structure of FIGS. 12A-12E following the removal of portions of the substrate 202 stopping on the etch stop layer 204. FIG. 13D shows a third side cross-sectional view 1385 of the structure of FIGS. 12A-12E following the removal of portions of the substrate 202 stopping on the etch stop layer 204. FIG. 13E shows a fourth side cross-sectional view 1395 of the structure of FIGS. 12A-12E following the removal of portions of the substrate 202 stopping on the etch stop layer 204. The first side cross-sectional view 1300 of FIG. 13A is taken along the line A-A in the top-down view 1375, while the second, third and fourth side cross-sectional views 1365, 1385 and 1395 of FIGS. 13B, 13D and 13E are taken along the line B/D/E-B/D/E in the top-down view 1375.

Using the carrier wafer 248, the structure may be "flipped" and portions of the substrate 202 may be removed from the back side. Removal of the portions of the substrate 202 will stop on the etch stop layer 204 as illustrated in FIGS. 13A-13E.

Figures 14A, 14B, 14C:
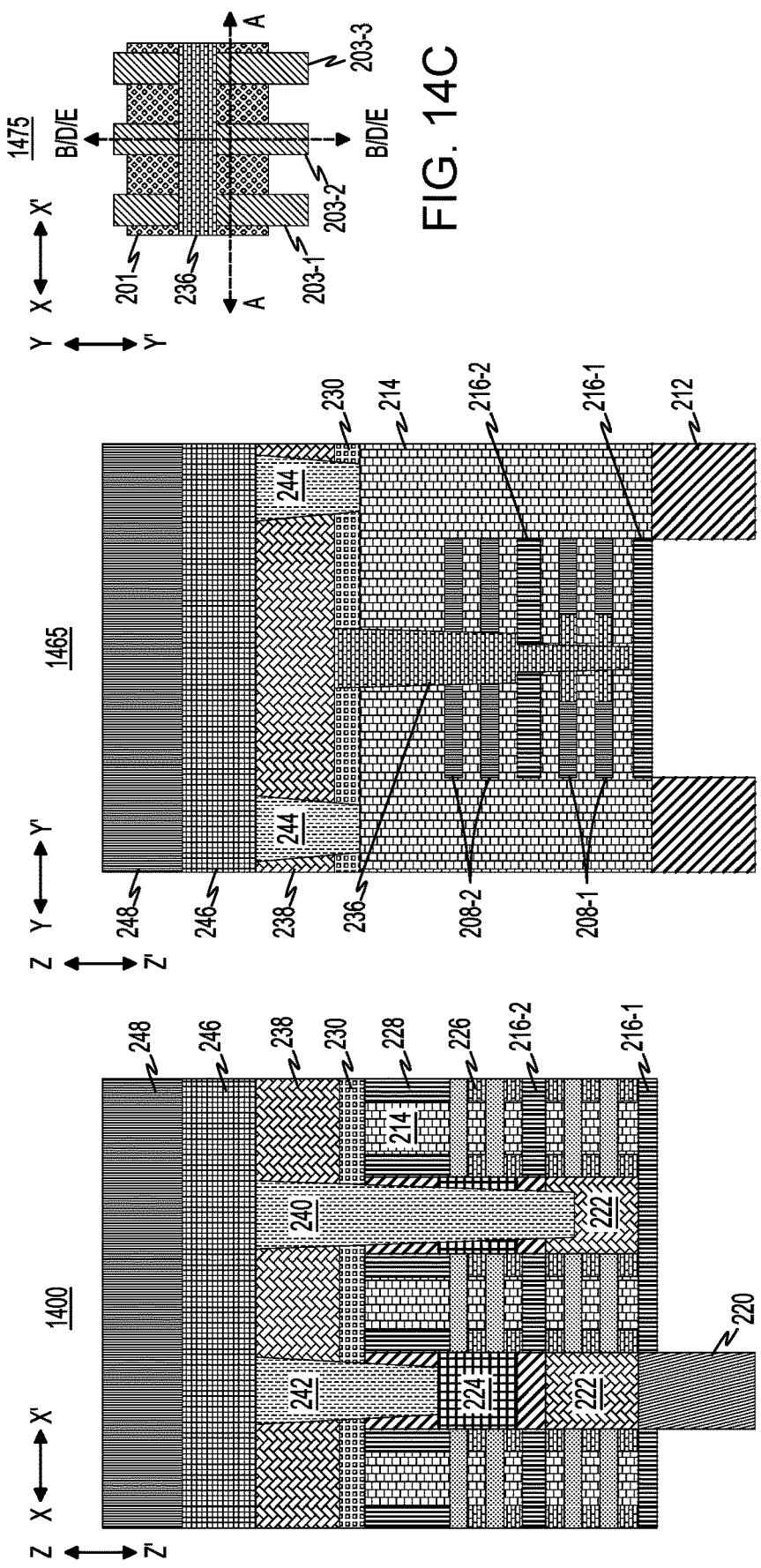
FIG. 14A depicts a first side cross-sectional view of the structure of FIGS. 13A-13E following removal of the etch stop layer and remaining exposed portions of the substrate, according to an embodiment of the invention.
FIG. 14B depicts a second side cross-sectional view of the structure of FIGS. 13A-13E following the removal of the etch stop layer and the remaining exposed portions of the substrate, according to an embodiment of the invention.
FIG. 14C depicts a top-down view of the structure of FIGS. 13A-13E following the removal of the etch stop layer and the remaining exposed portions of the substrate, according to an embodiment of the invention.
Figure 14E:
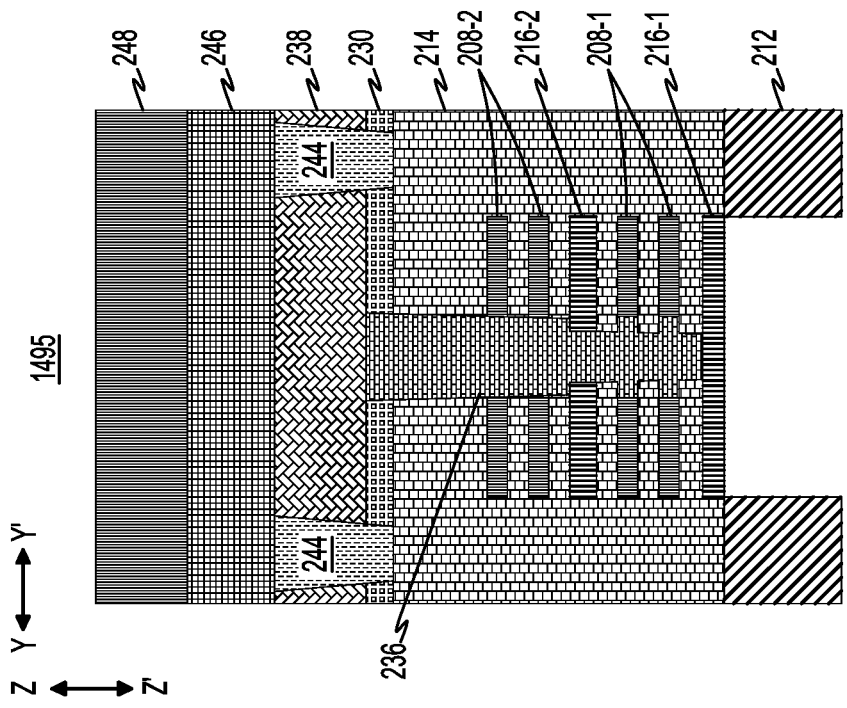
FIG. 14E depicts a fourth side cross-sectional view of the structure of FIGS. 13A-13E following the removal of the etch stop layer and the remaining exposed portions of the substrate, according to an embodiment of the invention.
Figure 14D:
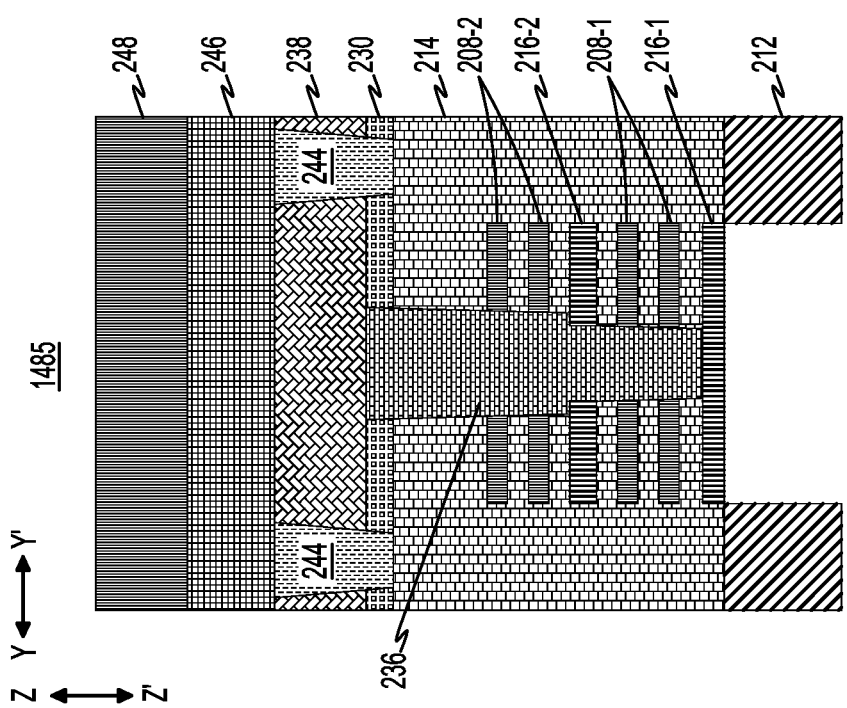
FIG. 14D depicts a third side cross-sectional view of the structure of FIGS. 13A-13E following the removal of the etch stop layer and the remaining exposed portions of the substrate, according to an embodiment of the invention.

FIG. 14A shows a first side cross-sectional view 1400 of the structure of FIGS. 13A-13E following removal of the etch stop layer 204 and remaining portions of the substrate 202. FIG. 14B shows a second side cross-sectional view 1465 of the structure of FIGS. 13A-13E following the removal of the etch stop layer 204 and the remaining portions of the substrate 202. FIG. 14C shows a top-down view 1475 of the structure of FIGS. 13A-13E following the removal of the etch stop layer 204 and the remaining portions of the substrate 202. FIG. 14D shows a third side cross-sectional view 1485 of the structure of FIGS. 13A-13E following the removal of the etch stop layer 204 and the remaining portions of the substrate 202. FIG. 14E shows a fourth side cross-sectional view 1495 of the structure of FIGS. 13A-13E following the removal of the etch stop layer 204 and the remaining portions of the substrate 202. The first side cross-sectional view 1400 of FIG. 14A is taken along the line A-A in the top-down view 1475, while the second, third and fourth side cross-sectional views 1465, 1485 and 1495 of FIGS. 14B, 14D and 14E are taken along the line B/D/E-B/D/E in the top-down view 1475.

As shown in FIGS. 14A-14E, the etch stop layer 204 is removed, followed by removal of the remaining portions of the substrate 202 to expose the BDI layer 216-1 and the sacrificial placeholder layer 220.

Figure 15E:
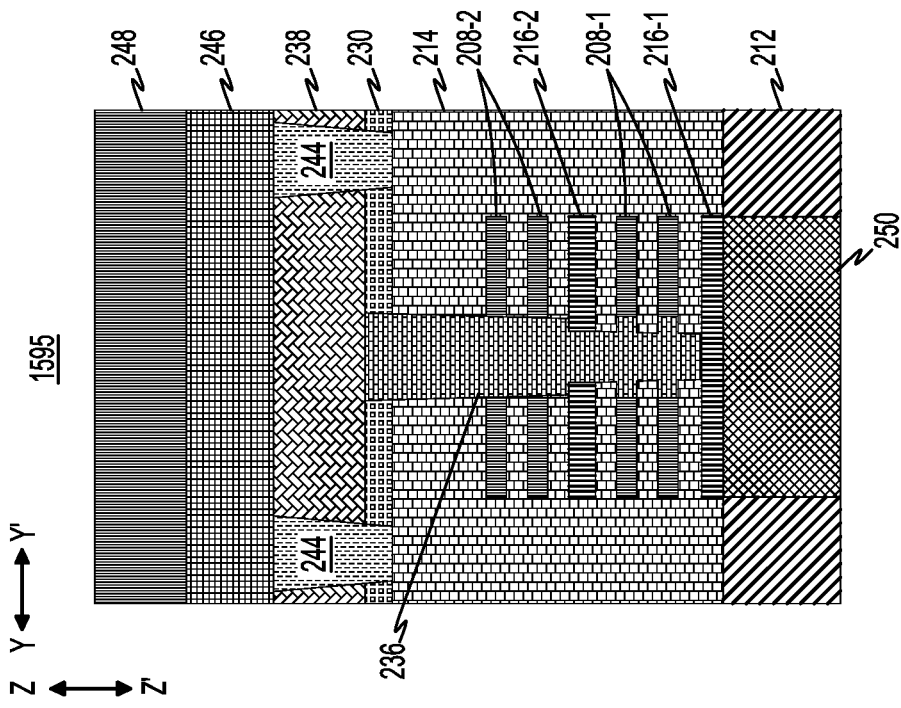
FIG. 15E depicts a fourth side cross-sectional view of the structure of FIGS. 14A-14E following the deposition and planarization of the interlayer dielectric on the back side of the structure, according to an embodiment of the invention.
Figure 15D:
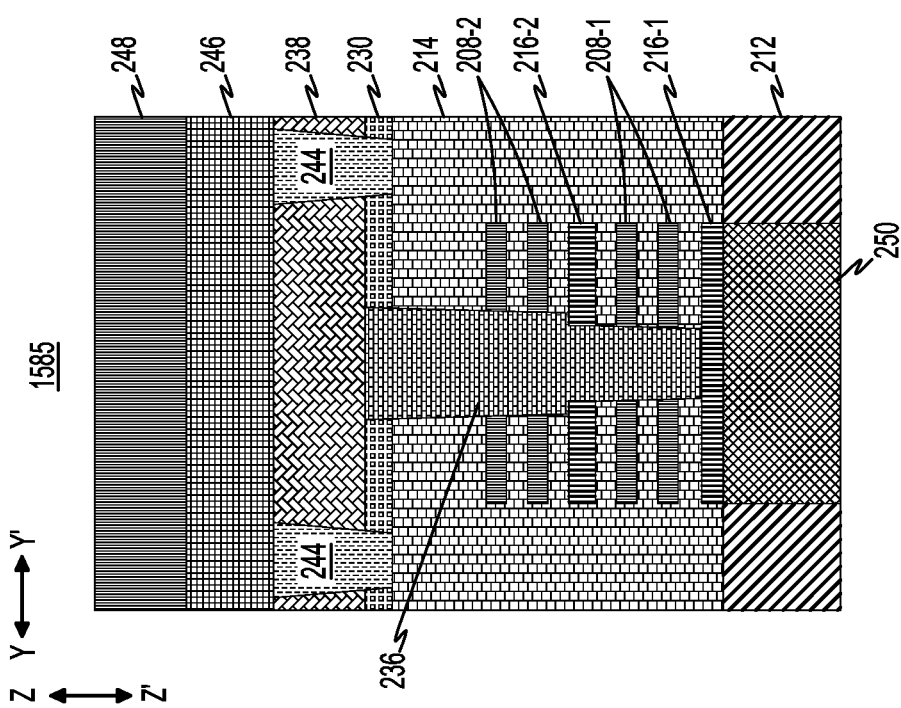
FIG. 15D depicts a third side cross-sectional view of the structure of FIGS. 14A-14E following the deposition and planarization of the interlayer dielectric on the back side of the structure, according to an embodiment of the invention.

FIG. 15A shows a first side cross-sectional view 1500 of the structure of FIGS. 14A-14E following formation of a back side ILD layer 250. FIG. 15B shows a second side cross-sectional view 1565 of the structure of FIGS. 14A-14E following the formation of the back side ILD layer 250. FIG. 15C shows a top-down view 1575 of the structure of FIGS. 14A-14E following the formation of the back side ILD layer 250. FIG. 15D shows a third side cross-sectional view 1585 of the structure of FIGS. 14A-14E following the formation of the back side ILD layer 250. FIG. shows a fourth side cross-sectional view 1595 of the structure of FIGS. 14A-14E following the formation of the back side ILD layer 250. The first side cross-sectional view 1500 of FIG. is taken along the line A-A in the top-down view 1575, while the second, third and fourth side cross-sectional views 1565, 1585 and 1595 of FIGS. 15B, 15D and 15E are taken along the line B/D/E-B/D/E in the top-down view 1575.

The back side ILD layer 250 may be formed of similar materials as the ILD layer 238. The material of the back side ILD layer 250 may initially be overfilled, followed by planarization (e.g., using CMP) stopping on the sacrificial placeholder layer 220 and STI regions 212 as shown.

Figures 16A, 16B, 16C:
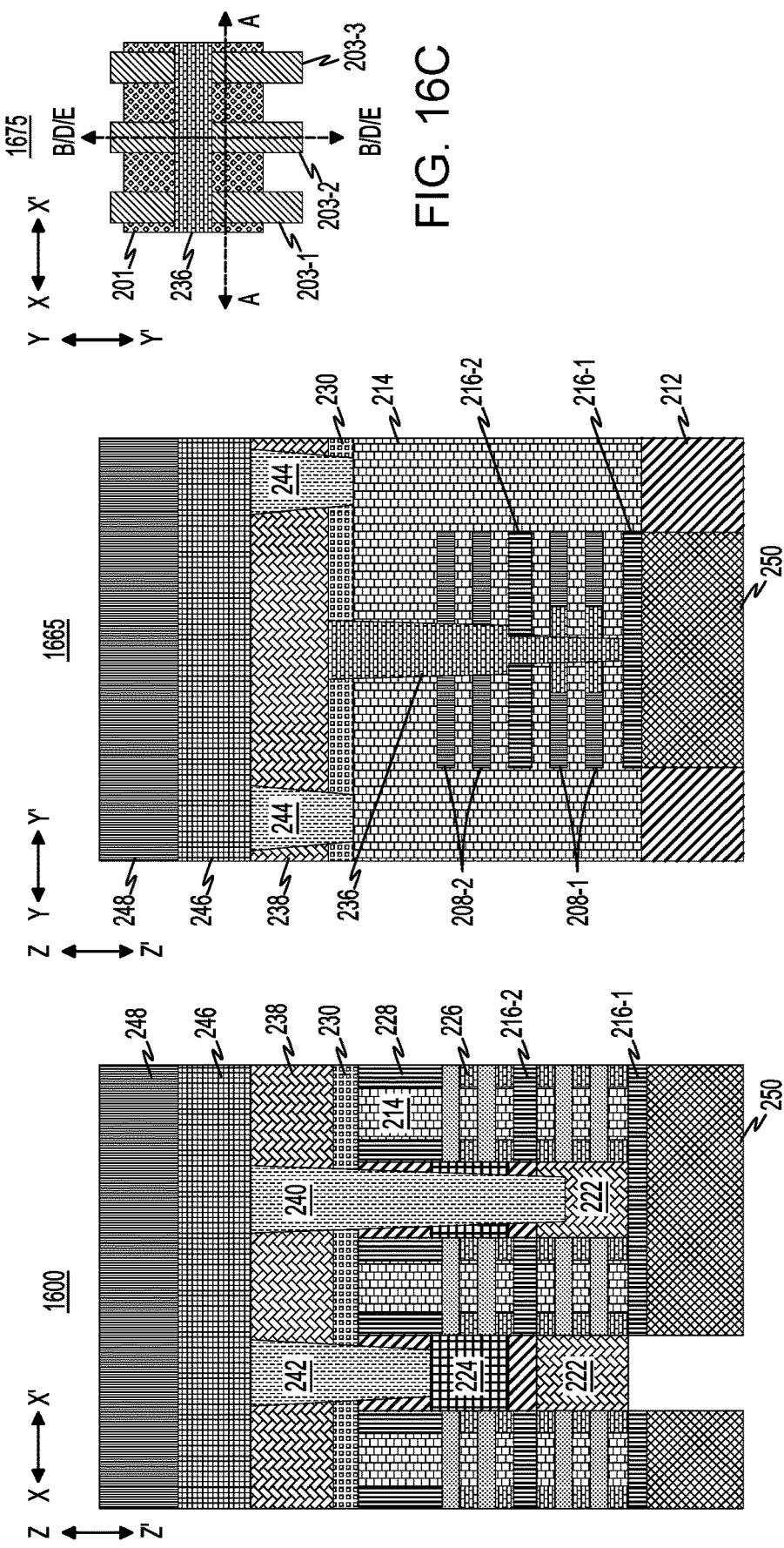
FIG. 16A depicts a first side cross-sectional view of the structure of FIGS. 15A-15E following removal of a sacrificial placeholder from the back side of the structure, according to an embodiment of the invention.
FIG. 16B depicts a second side cross-sectional view of the structure of FIGS. 15A-15E following the removal of the sacrificial placeholder from the back side of the structure, according to an embodiment of the invention.
FIG. 16C depicts a top-down view of the structure of FIGS. 15A-15E following the removal of the sacrificial placeholder from the back side of the structure, according to an embodiment of the invention.
Figure 16E:
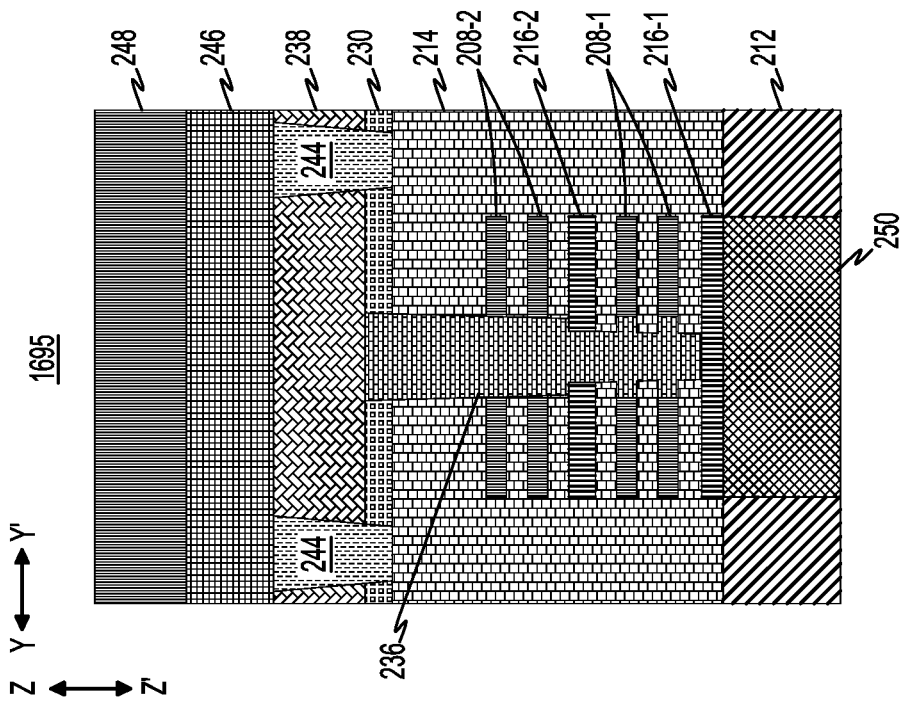
FIG. 16E depicts a fourth side cross-sectional view of the structure of FIGS. 15A-15E following the removal of the sacrificial placeholder from the back side of the structure, according to an embodiment of the invention.
Figure 16D:
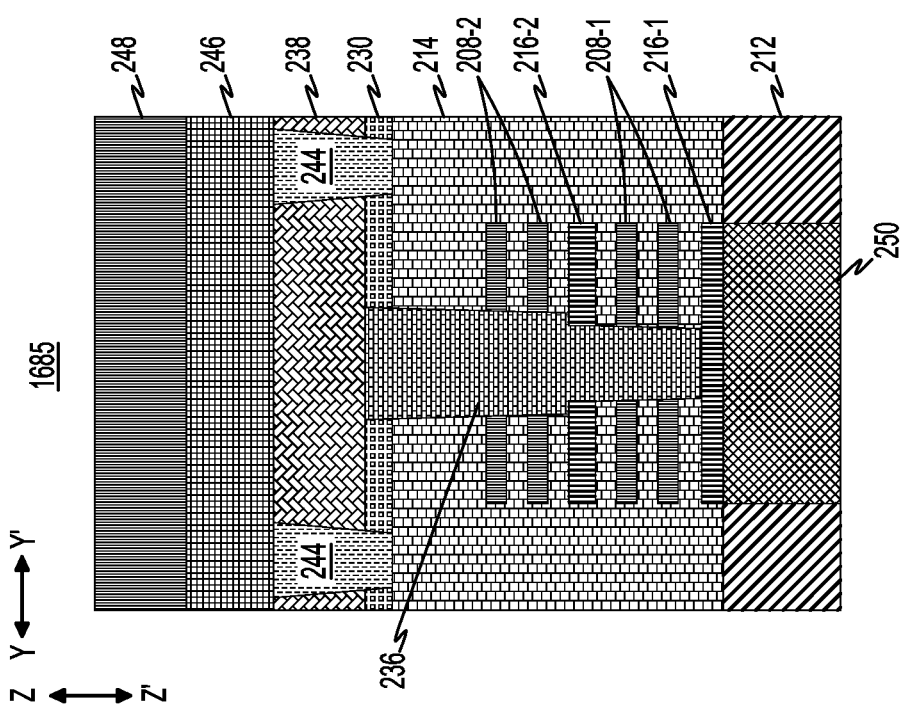
FIG. 16D depicts a third side cross-sectional view of the structure of FIGS. 15A-15E following the removal of the sacrificial placeholder from the back side of the structure, according to an embodiment of the invention.

FIG. 16A shows a first side cross-sectional view 1600 of the structure of FIGS. 15A-15E following removal of the sacrificial placeholder layer 220. The sacrificial placeholder layer 220 may be removed using any suitable etch processing that removes the material of the sacrificial placeholder layer 220 selective to that of the rest of the structure. FIG. 16B shows a second side cross-sectional view 1665 of the structure of FIGS. 15A-15E following the removal of the sacrificial placeholder layer 220. FIG. 16C shows a top-down view 1675 of the structure of FIGS. following the removal of the sacrificial placeholder layer 220. FIG. 16D shows a third side cross-sectional view 1685 of the structure of FIGS. 15A-15E following the removal of the sacrificial placeholder layer 220. FIG. 16E shows a fourth side cross-sectional view 1695 of the structure of FIGS. 15A-15E following the removal of the sacrificial placeholder layer 220. The first side cross-sectional view 1600 of FIG. 16A is taken along the line A-A in the top-down view 1675, while the second, third and fourth side cross-sectional views 1665, 1685 and 1695 of FIGS. 16B, 16D and 16E are taken along the line B/D/E-B/D/E in the top-down view 1675.

Figures 17A, 17B, 17C:
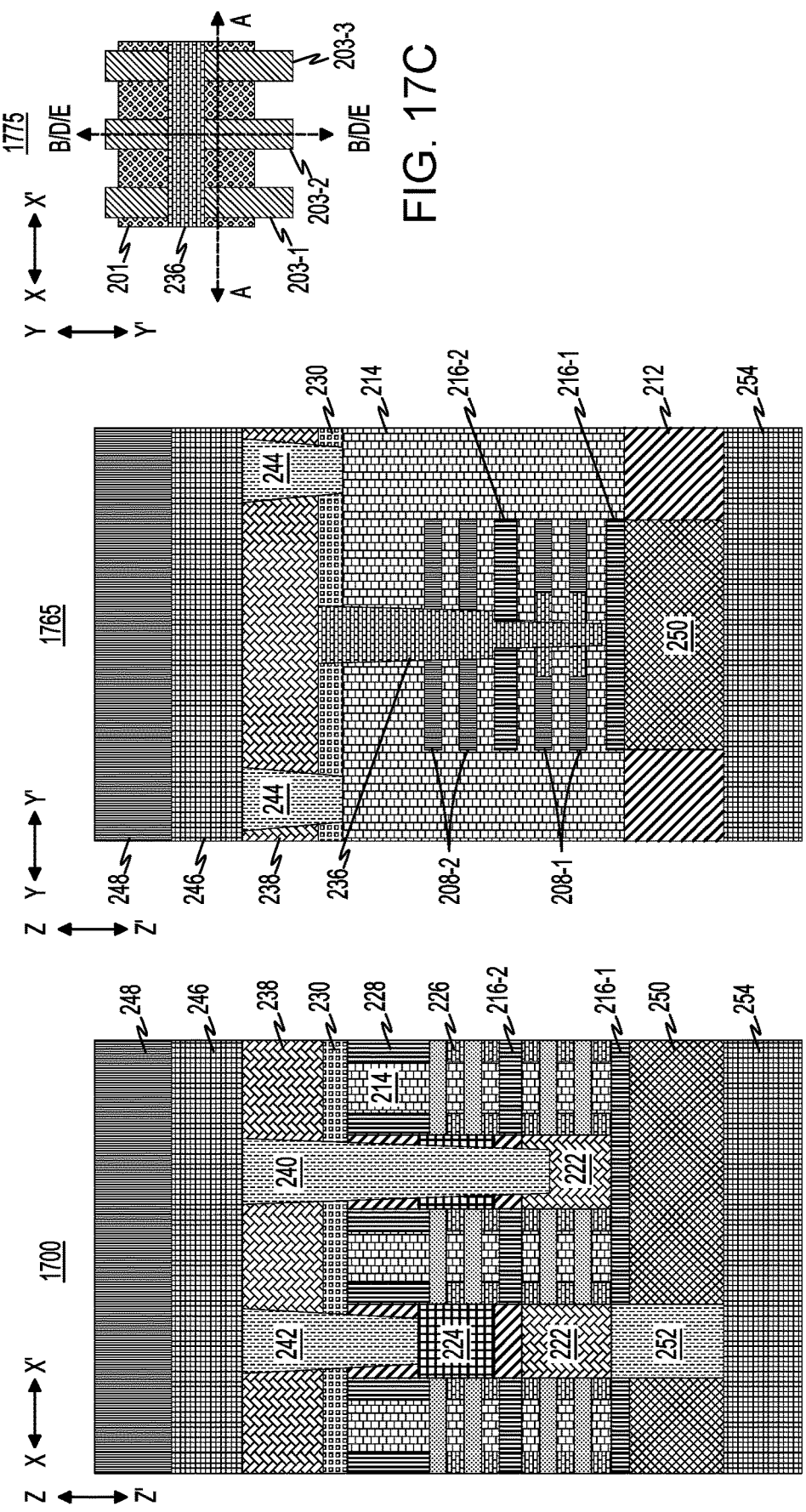
FIG. 17A depicts a first side cross-sectional view of the structure of FIGS. 16A-16E following back side contact metallization and interconnect formation, according to an embodiment of the invention.
FIG. 17B depicts a second side cross-sectional view of the structure of FIGS. 16A-16E following the back side contact metallization and interconnect formation, according to an embodiment of the invention.
FIG. 17C depicts a top-down view of the structure of FIGS. 16A-16E following the back side contact metallization and interconnect formation, according to an embodiment of the invention.
Figure 17E:
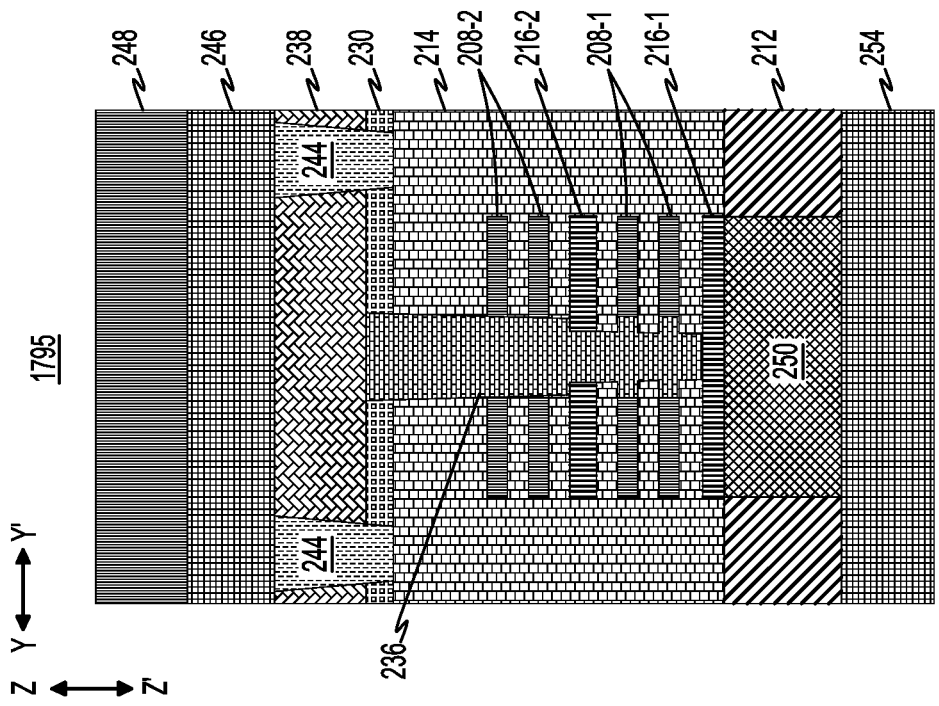
FIG. 17E depicts a fourth side cross-sectional view of the structure of FIGS. 16A-16E following the back side contact metallization and interconnect formation, according to an embodiment of the invention.
Figure 17D:
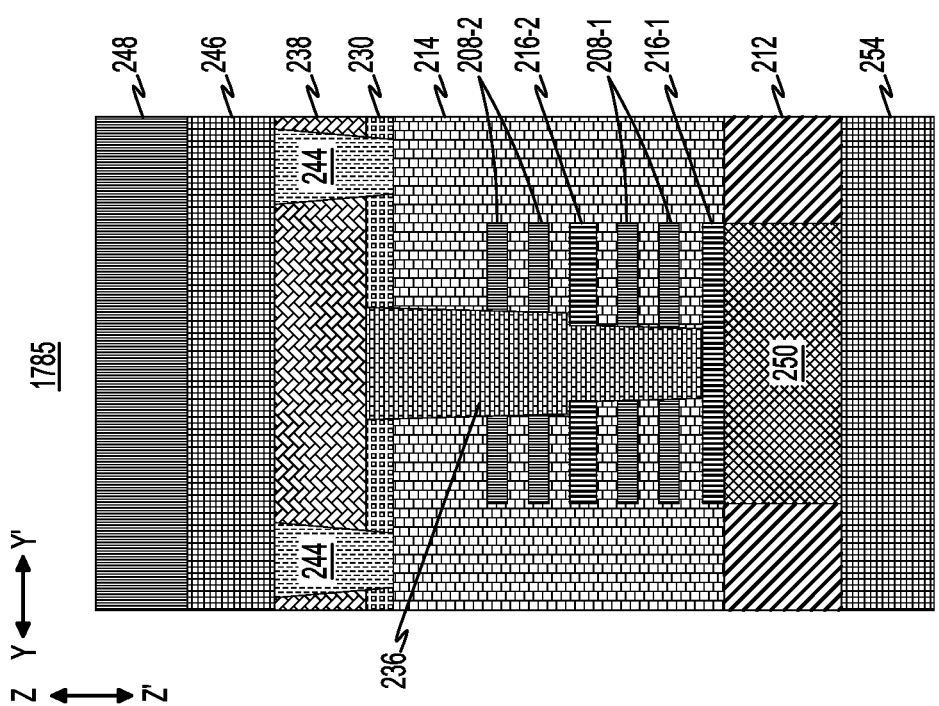
FIG. 17D depicts a third side cross-sectional view of the structure of FIGS. 16A-16E following the back side contact metallization and interconnect formation, according to an embodiment of the invention.

FIG. 17A shows a first side cross-sectional view 1700 of the structure of FIGS. 16A-16E following formation of back side bottom source/drain contact 252 and back side interconnects 254. FIG. 17B shows a second side cross-sectional view 1765 of the structure of FIGS. 16A-16E following the formation of the back side bottom source/drain contact 252 and the back side interconnects 254. FIG. 17C shows a top-down view 1775 of the structure of FIGS. 16A-16E following the formation of the back side bottom source/drain contact 252 and the back side interconnects 254. FIG. 17D shows a third side cross-sectional view 1785 of the structure of FIGS. 16A-16E following the formation of the back side bottom source/drain contact 252 and the back side interconnects 254. FIG. 17E shows a fourth side cross-sectional view 1795 of the structure of FIGS. 16A-16E following the formation of the back side bottom source/drain contact 252 and the back side interconnects 254. The first side cross-sectional view 1700 of FIG. 17A is taken along the line A-A in the top-down view 1775, while the second, third and fourth side cross-sectional views 1765, 1785 and 1795 of FIGS. 17B, 17D and 17E are taken along the line B/D/E-B/D/E in the top-down view 1775.

The back side bottom source/drain contact 252 may be formed by fill and planarization of contact material. The contact material of the back side bottom source/drain contact 252 may be similar to that of the top source/drain contact 242, bottom source/drain contact 240 and gate contacts 244. The back side bottom source/drain contact 252 may have a width (in direction X-X') matching that of the bottom source/drain regions 222.

The back side interconnects 254 may be formed with similar sizing and composition as that of the front side BEOL interconnects 246.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 18:
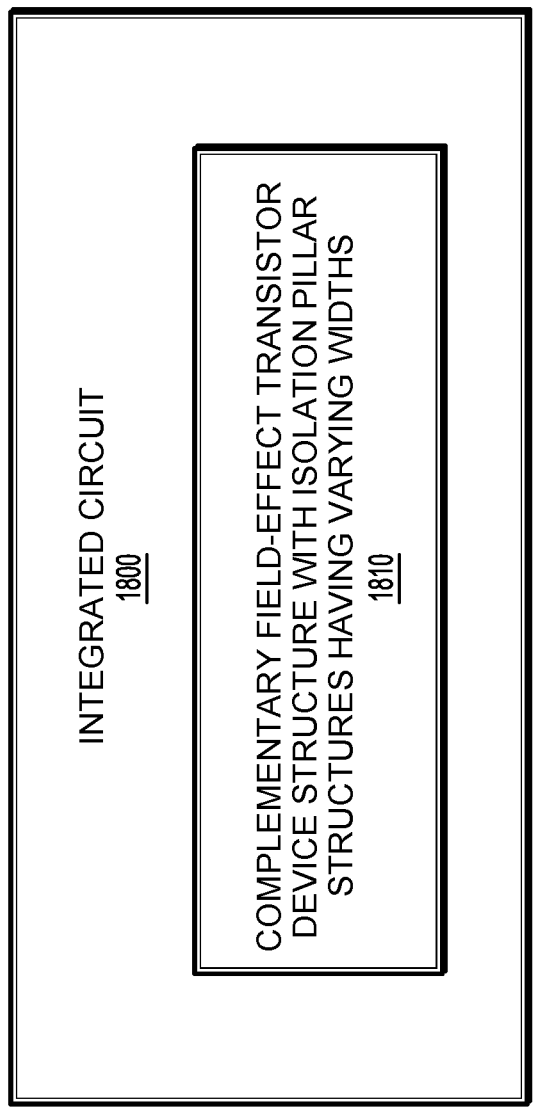
FIG. 18 depicts an integrated circuit comprising complementary field-effect transistor device structures with isolation pillar structures having varying widths, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 18 shows an example integrated circuit 1800 which includes one or more CFET device structures 1810 with isolation pillar structures having varying widths.

In some embodiments, a microelectronic structure comprises a first stacked device structure comprising a first upper device and a first lower device, a second stacked device structure comprising a second upper device and a second lower device, and an isolation pillar structure located between the first and second stacked device structures. The isolation pillar structure has an upper section contacting the first and second upper devices and a lower section contacting the first and second lower devices. The upper section of the isolation pillar structure has a first width and the lower section of the isolation pillar structure has a second width different than the first width.

The first and second upper devices and the first and second lower devices may comprise respective FET devices.

The first and second upper devices and the first and second lower devices may comprise respective nanosheet FET devices.

The first and second stacked device structures may provide a CFET structure.

One of the first upper device and the first lower device in the first stacked device structure may comprise an nFET device and the other one of the first upper device and the second lower device in the first stacked device structure may comprises a pFET device. The first width of the upper section of the isolation pillar and the second width of the lower section of the isolation pillar controls a ratio of an n-type active area size of the nFET device to a p-type active area size of the pFET device.

In some embodiments, a microelectronic structure comprises a first stacked FET structure comprising a first lower FET device and a first upper FET device, a second stacked FET structure comprising a second lower FET device and a second upper FET device, and an isolation pillar structure between the first stacked FET structure and the second stacked FET structure, the isolation pillar structure having an upper section with a first width and a lower section with a second width different than the first width.

The upper section of the isolation pillar structure may contact channels of the first and second upper FET devices in the first and second stacked FET structures, and the lower section of the isolation pillar structure may contact channels of the first and second lower FET devices in the first and second stacked FET structures. The isolation pillar structure may separate channels, gates and source/drain regions of the first and second upper and lower FET devices in the first and second stacked FET structures.

The first width of the upper section of the isolation pillar structure may be greater than the second width of the lower section of the isolation pillar structure.

The isolation pillar structure may further comprise extension sections that extend outwards from the lower section towards indents in channels of the first and second lower FET devices in the first and second stacked FET structures.

Channels of the first and second upper FET devices in the first and second stacked FET structures may have a greater width than channels of the first and second lower FET devices in the first and second stacked FET structures.

Channels of the first and second upper FET devices in the first and second stacked FET structures may have a smaller width than channels of the first and second lower FET devices in the first and second stacked FET structures.

Channels of the first and second upper FET devices in the first and second stacked FET structures may have a same width as channels of the first and second lower FET devices in the first and second stacked FET structures.

In some embodiments, an integrated circuit comprises a CFET structure comprising a first stacked FET structure comprising a first lower FET device and a first upper FET device, a second stacked FET structure comprising a second lower FET device and a second upper FET device, and an isolation pillar structure between the first stacked FET structure and the second stacked FET structure, the isolation pillar structure having an upper section with a first width and a lower section with a second width different than the first width.

The upper section of the isolation pillar structure may contact channels of the first and second upper FET devices in the first and second stacked FET structures, and the lower section of the isolation pillar structure may contact channels of the first and second lower FET devices in the first and second stacked FET structures.

In some embodiments, a microelectronic structure comprises two or more stacked FET structures, each of the two or more stacked FET structures comprising two or more FET devices stacked over one another, and an isolation pillar structure separating first and second ones of the two or more stacked FET structures. The isolation pillar structure comprises a first section contacting channels of at least first ones of the two or more FET devices in the first and second stacked FET structures and a second section contacting channels of at least second ones of the two or more FET devices in the first and second stacked FET structures. The first section of the isolation pillar structure has a first width and the second section of the isolation pillar structure has a second width different than the first width.

The first ones of the two or more FET devices may comprise nFET devices and the second ones of the two or more FET devices may comprise pFET devices. The first width of the isolation pillar structure may define a first active region area of the nFET devices and the second width of the isolation pillar may define a second active region area of the pFET devices.

The microelectronic structure may further comprise an additional isolation pillar structure separating third and fourth ones of the two or more stacked FET structures, wherein the additional isolation pillar structure comprises a first section contacting channels of at least first ones of the two or more FET devices in the third and fourth stacked FET structures and a second section contacting channels of at least second ones of the two or more FET devices in the third and fourth stacked FET structures, wherein the first section of the additional isolation pillar structure has a third width and the second section of the isolation pillar structure has a fourth width different than the third width, and wherein at least one of the third width is different than the first width and the fourth width is different than the second width.

In some embodiments, a method comprises forming first and second stacked FET device structures, each of the first and second stacked FET devices comprising an upper FET device and a lower FET device, wherein the upper FET devices of the first and second stacked FET device structures have merged channels, and wherein lower FET devices of the first and second stacked FET device structures have merged channels. The method also comprises forming an isolation pillar structure between the first and second stacked FET structures, the isolation pillar structure comprising an upper section with a first width that separates the merged channels of the upper FET devices of the first and second stacked FET device structures and a lower section with a second width different than the first width that separate the merged channels of the lower FET devices of the first and second stacked FET device structures.

Forming the isolation pillar structure may comprise performing a first cut process that etches through the merged channels of the upper FET devices of the first and second stacked FET device structures, the first cut process stopping on a middle dielectric isolation layer disposed between the upper FET devices and the lower FET devices of the first and second stacked FET device structures, forming a protection spacer on exposed sidewalls of the channels of the upper FET devices of the first and second stacked FET device structures, and performing a second cut process that etches through the merged channels of the lower FET devices of the first and second stacked FET device structures, the second cut process stopping on a bottom dielectric isolation layer disposed below the lower FET devices of the first and second stacked FET device structures.

Forming the isolation pillar structure may further comprise performing an indent etch that removes portions of the channels of the lower FET devices.

Forming the isolation pillar structure may further comprise removing the protection spacer, and filling a dielectric material in spaces exposed by the first cut process, the second cut process, and the indent etch. The indent etch controls a ratio of a lower active region area of the lower FET devices to an upper active region area of the upper FET devices. The lower FET devices may comprise one of nFET devices and pFET devices, and the upper FET devices may comprise the other one of nFET devices and pFET devices.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A microelectronic structure comprising:
a first stacked device structure comprising a first upper device and a first lower device;
a second stacked device structure comprising a second upper device and a second lower device;
an isolation pillar structure located between the first and second stacked device structures;
wherein the isolation pillar structure has an upper section contacting the first and second upper devices and a lower section contacting the first and second lower devices; and
wherein the upper section of the isolation pillar structure has a first width and the lower section of the isolation pillar structure has a second width different than the first width.

2. The microelectronic structure of claim 1, wherein the first and second upper devices and the first and second lower devices comprise respective field-effect transistor devices.

3. The microelectronic structure of claim 1, wherein the first and second upper devices and the first and second lower devices comprise respective nanosheet field-effect transistor devices.

4. The microelectronic structure of claim 1, wherein the first and second stacked device structures provide a complementary field-effect transistor structure.

5. The microelectronic structure of claim 1, wherein one of the first upper device and the first lower device in the first stacked device structure comprises an n-type field-effect transistor device and the other one of the first upper device and the second lower device in the first stacked device structure comprises a p-type field-effect transistor device.

6. The microelectronic structure of claim 5, wherein the first width of the upper section of the isolation pillar and the second width of the lower section of the isolation pillar controls a ratio of an n-type active area size of the n-type field-effect transistor device to a p-type active area size of the p-type field-effect transistor device.

7. A microelectronic structure comprising:
a first stacked field-effect transistor structure comprising a first lower field-effect transistor device and a first upper field-effect transistor device;
a second stacked field-effect transistor structure comprising a second lower field-effect transistor device and a second upper field-effect transistor device; and
an isolation pillar structure between the first stacked field-effect transistor structure and the second stacked field-effect transistor structure, the isolation pillar structure having an upper section with a first width and a lower section with a second width different than the first width.

8. The microelectronic structure of claim 7, wherein the upper section of the isolation pillar structure contacts channels of the first and second upper field-effect transistor devices in the first and second stacked field-effect transistor structures, and wherein the lower section of the isolation pillar structure contacts channels of the first and second lower field-effect transistor devices in the first and second stacked field-effect transistor structures.

9. The microelectronic structure of claim 7, wherein the isolation pillar structure separates channels, gates and source/drain regions of the first and second upper and lower field-effect transistor devices in the first and second stacked field-effect transistor structures.

10. The microelectronic structure of claim 7, wherein the first width of the upper section of the isolation pillar structure is greater than the second width of the lower section of the isolation pillar structure.

11. The microelectronic structure of claim 7, wherein the isolation pillar structure further comprises extension sections that extend outwards from the lower section towards indents in channels of the first and second lower field-effect transistor devices in the first and second stacked field-effect transistor structures.

12. The microelectronic structure of claim 7, wherein channels of the first and second upper field-effect transistor devices in the first and second stacked field-effect transistor structures have a greater width than channels of the first and second lower field-effect transistor devices in the first and second stacked field-effect transistor structures.

13. The microelectronic structure of claim 7, wherein channels of the first and second upper field-effect transistor devices in the first and second stacked field-effect transistor structures have a smaller width than channels of the first and second lower field-effect transistor devices in the first and second stacked field-effect transistor structures.

14. The microelectronic structure of claim 7, wherein channels of the first and second upper field-effect transistor devices in the first and second stacked field-effect transistor structures have a same width as channels of the first and second lower field-effect transistor devices in the first and second stacked field-effect transistor structures.

15. An integrated circuit comprising:
a complementary field-effect transistor structure comprising:
a first stacked field-effect transistor structure comprising a first lower field-effect transistor device and a first upper field-effect transistor device;
a second stacked field-effect transistor structure comprising a second lower field-effect transistor device and a second upper field-effect transistor device; and
an isolation pillar structure between the first stacked field-effect transistor structure and the second stacked field-effect transistor structure, the isolation pillar structure having an upper section with a first width and a lower section with a second width different than the first width.

16. The integrated circuit of claim 15, wherein the upper section of the isolation pillar structure contacts channels of the first and second upper field-effect transistor devices in the first and second stacked field-effect transistor structures, and wherein the lower section of the isolation pillar structure contacts channels of the first and second lower field-effect transistor devices in the first and second stacked field-effect transistor structures.

17. A microelectronic structure comprising:
two or more stacked field-effect transistor structures, each of the two or more stacked field-effect transistor structures comprising two or more field-effect transistor devices stacked over one another; and
an isolation pillar structure separating first and second ones of the two or more stacked field-effect transistor structures;
wherein the isolation pillar structure comprises a first section contacting channels of at least first ones of the two or more field-effect transistor devices in the first and second ones of the two or more stacked field-effect transistor structures and a second section contacting channels of at least second ones of the two or more field-effect transistor devices in the first and second ones of the two or more stacked field-effect transistor structures; and wherein the first section of the isolation pillar structure has a first width and the second section of the isolation pillar structure has a second width different than the first width.

18. The microelectronic structure of claim 17, wherein the first ones of the two or more field-effect transistor devices comprise n-type field-effect transistor devices and the second ones of the two or more field-effect transistor devices comprise p-type field-effect transistor devices, and wherein the first width of the isolation pillar structure defines a first active region area of the n-type field-effect transistor devices and the second width of the isolation pillar defines a second active region area of the p-type field-effect transistor devices.

19. The microelectronic structure of claim 17, further comprise an additional isolation pillar structure separating third and fourth ones of the two or more stacked field-effect transistor structures, wherein the additional isolation pillar structure comprises a first section contacting channels of at least first ones of the two or more field-effect transistor devices in the third and fourth ones of the two or more stacked field-effect transistor structures and a second section contacting channels of at least second ones of the two or more field-effect transistor devices in the third and fourth ones of the two or more stacked field-effect transistor structures, wherein the first section of the additional isolation pillar structure has a third width and the second section of the isolation pillar structure has a fourth width different than the third width, and wherein at least one of the third width is different than the first width and the fourth width is different than the second width.

20. A method comprising:
forming first and second stacked field-effect transistor device structures, each of the first and second stacked field-effect transistor device structures comprising an upper field-effect transistor device and a lower field-effect transistor device, wherein the upper field-effect transistor devices of the first and second stacked field-effect transistor device structures have merged channels, and wherein lower field-effect transistor devices of the first and second stacked field-effect transistor device structures have merged channels; and forming an isolation pillar structure between the first and second stacked field-effect transistor structures, the isolation pillar structure comprising an upper section with a first width that separates the merged channels of the upper field-effect transistor devices of the first and second stacked field-effect transistor device structures and a lower section with a second width different than the first width that separate the merged channels of the lower field-effect transistor devices of the first and second stacked field-effect transistor device structures.

21. The method of claim 20, wherein forming the isolation pillar structure comprises:
performing a first cut process that etches through the merged channels of the upper field-effect transistor devices of the first and second stacked field-effect transistor device structures, the first cut process stopping on a middle dielectric isolation layer disposed between the upper field-effect transistor devices and the lower field-effect transistor devices of the first and second stacked field-effect transistor device structures;

forming a protection spacer on exposed sidewalls of the merged channels of the upper field-effect transistor devices of the first and second stacked field-effect transistor device structures; and performing a second cut process that etches through the merged channels of the lower field-effect transistor devices of the first and second stacked field-effect transistor device structures, the second cut process stopping on a bottom dielectric isolation layer disposed below the lower field-effect transistor devices of the first and second stacked field-effect transistor device structures.

22. The method of claim 21, wherein forming the isolation pillar structure further comprises performing an indent etch that removes portions of the merged channels of the lower field-effect transistor devices.

23. The method of claim 22, wherein forming the isolation pillar structure further comprises:
removing the protection spacer; and
filling a dielectric material in spaces exposed by the first cut process, the second cut process, and the indent etch.

24. The method of claim 22, wherein the indent etch controls a ratio of a lower active region area of the lower field-effect transistor devices to an upper active region area of the upper field-effect transistor devices.

25. The method of claim 24, wherein the lower field-effect transistor devices comprise one of n-type field-effect transistor devices and p-type field-effect transistor devices, and the upper field-effect transistor devices comprise the other one of n-type field-effect transistor devices and p-type field-effect transistor devices.

* * * * *